US009582617B2

(12) United States Patent
Taoka

(10) Patent No.: US 9,582,617 B2
(45) Date of Patent: Feb. 28, 2017

(54) SIMULATION DEVICE AND SIMULATION PROGRAM FOR SIMULATING PROCESS USING FIRST AND SECOND MASKS

(71) Applicant: Renesas Electronics Corporation, Kawasaki-shi, Kanagawa (JP)

(72) Inventor: Hironobu Taoka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 635 days.

(21) Appl. No.: 13/724,444

(22) Filed: Dec. 21, 2012

(65) Prior Publication Data
US 2013/0185042 A1  Jul. 18, 2013

(30) Foreign Application Priority Data
Dec. 29, 2011  (JP) ................................. 2011-290381

(51) Int. Cl.
| G06G 7/48 | (2006.01) |
| G06F 17/50 | (2006.01) |
| G03F 7/20 | (2006.01) |
| G03F 1/70 | (2012.01) |
| G03F 1/36 | (2012.01) |

(52) U.S. Cl.
CPC .......... G06F 17/5009 (2013.01); G03F 7/705 (2013.01); G03F 7/70441 (2013.01); G03F 7/70466 (2013.01); G03F 1/36 (2013.01); G03F 1/70 (2013.01)

(58) Field of Classification Search
CPC ...................................... G03F 1/70
USPC ........................................... 703/6
See application file for complete search history.

(56) References Cited

U.S. PATENT DOCUMENTS

| 6,133,986 | A  | * | 10/2000 | Johnson .......................... 355/67 |
| 6,255,024 | B1 | * | 7/2001 | Pierrat ...................... G03F 1/32 |
|  |  |  |  | 250/492.2 |
| 6,794,096 | B2 | * | 9/2004 | Kroyan ............................. 430/5 |

(Continued)

FOREIGN PATENT DOCUMENTS

| JP | 11-186152 A | 7/1999 |
| JP | 2009-94109 A | 4/2009 |
| JP | 2009-192811 A | 8/2009 |

OTHER PUBLICATIONS

Rosenbluth et al.; Optimum mask and source patterns to print a given shape; Journal of Microlithography, Microfabrication, and Microsystems, v. 1 n. 1; 2002; pp. 13-30.*

*Primary Examiner* — Hugh Jones
(74) *Attorney, Agent, or Firm* — Foley & Lardner LLP

(57) ABSTRACT

A simulation device and simulation program are provided that can be suitably applied to a manufacturing process including a plurality of processing steps. The simulation device is provided for simulating the manufacturing process including a first processing step using a first mask, and a second processing step using a second mask. The simulation device includes first obtaining means for obtaining a first intensity distribution generated over a substrate of interest for processing by the first mask, second obtaining means for obtaining a second intensity distribution generated over the substrate by the second mask, and revising means for revising an intensity of a region in the first intensity distribution to be processed by the second mask, to a value regarded as a region not to be processed, based on the second intensity distribution.

14 Claims, 36 Drawing Sheets

(56) References Cited

U.S. PATENT DOCUMENTS

| | | |
|---|---|---|
| 8,059,262 B2 | 11/2011 | Yamazoe |
| 2009/0061362 A1* | 3/2009 | Taoka et al. ............ 430/319 |
| 2009/0210851 A1 | 8/2009 | Sato |
| 2012/0019805 A1 | 1/2012 | Yamazoe |

* cited by examiner

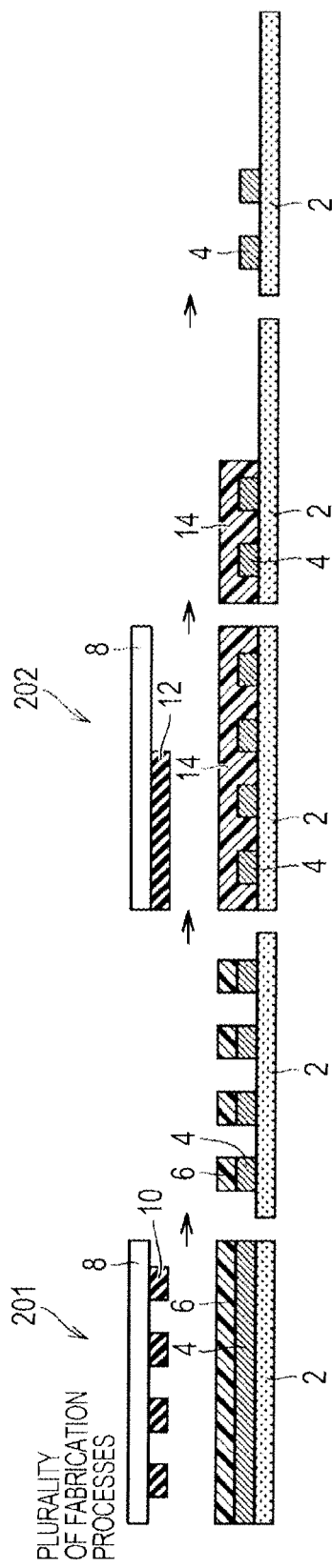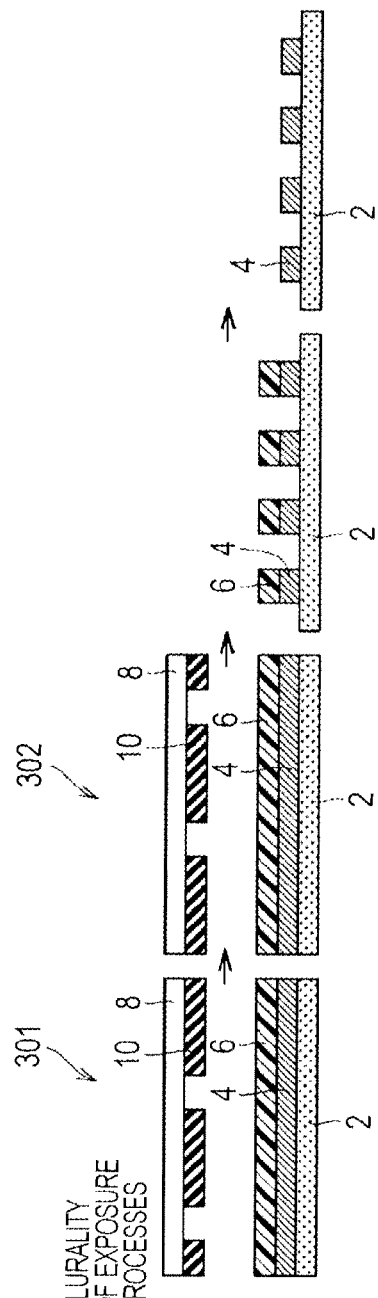

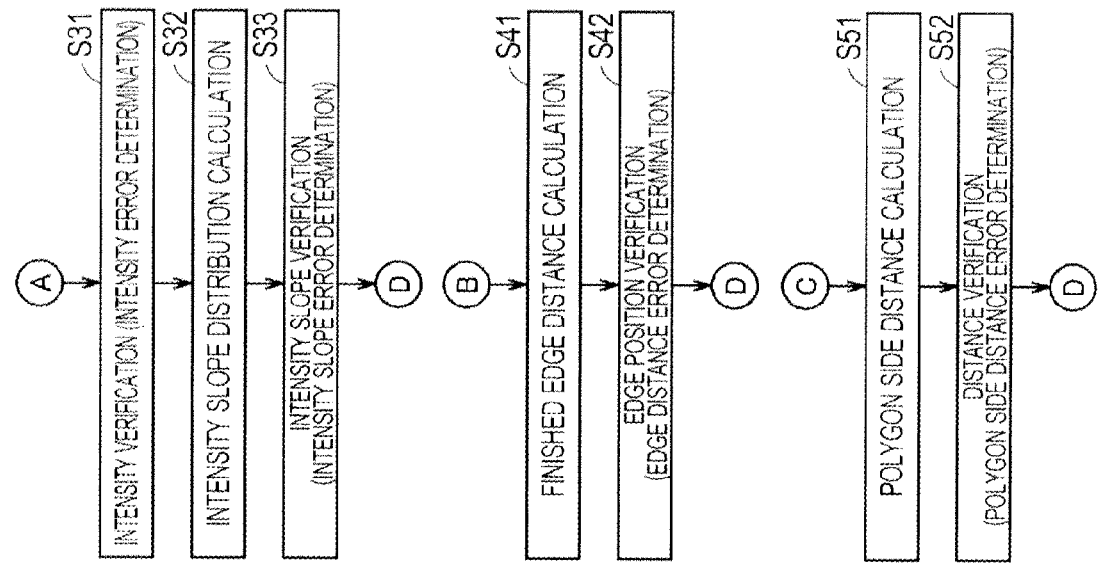
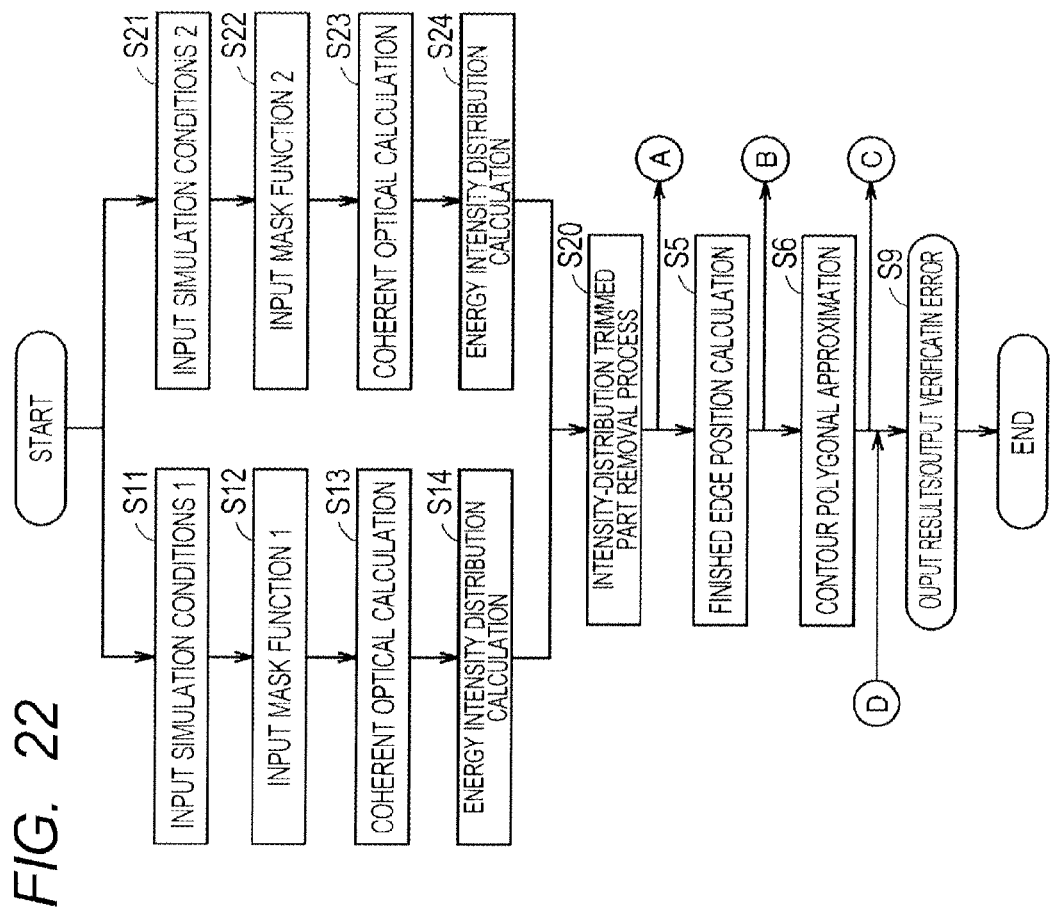
FIG. 22

SIMULATION DEVICE AND SIMULATION PROGRAM FOR SIMULATING PROCESS USING FIRST AND SECOND MASKS

CROSS-REFERENCE TO RELATED APPLICATIONS

The disclosure of Japanese Patent Application No. 2011-290381 filed on Dec. 29, 2011 including the specification, drawings and abstract is incorporated herein by reference in its entirety.

BACKGROUND

The present invention relates to simulation devices and simulation programs associated with the manufacturing of semiconductor devices, and more particularly, a simulation device and program which can be suitably used for a manufacturing process including a plurality of processing steps.

A lithography process is known as one of general semiconductor manufacturing techniques. The lithography process involves optically transferring a predetermined mask pattern to a wafer using an exposure device. The shape of the pattern (mask pattern) formed over the wafer using a predetermined photomask (hereinafter referred to as a simply "mask") through the lithography process in this way is estimated using a lithography simulation (hereinafter referred to as a simply "simulation") taking into consideration optical properties. The use of such simulation can also verify various types of lithography.

Related art techniques relating to the above lithography simulation are as follows.

Japanese Unexamined Patent Publication No. 2009-192811 (Patent Document 1) discloses a lithography simulation method that can achieve the estimation of a pattern with high accuracy, while suppressing increase in amount of calculation.

Japanese Unexamined Patent Publication No. 11-186152 (Patent Document 2) discloses an exposure simulation method which can calculate exposure simulation at high speed in a lithography step performed by a semiconductor manufacturing device.

Japanese Unexamined Patent Publication No. 2009-094109 discloses a calculation method for calculating a light intensity distribution (partial coherent imaging calculation) formed on the wafer surface in a short time.

RELATED ART DOCUMENTS

Patent Documents

[Patent Document 1]
Japanese Unexamined Patent Publication No. 2009-192811
[Patent Document 2]
Japanese Unexamined Patent Publication No. 1999-186152
[Patent Document 3]
Japanese Unexamined Patent Publication No. 2009-094109

SUMMARY

A process for manufacturing a semiconductor device has been put to practical use which involves performing a plurality of processing steps on the same wafer using different masks. In the related art, it is difficult to effectively perform simulation for such a manufacturing process by a small amount of calculation.

Other problems to be solved by the present invention, and new features of the present invention will become apparent from the description and accompanying drawings of the present specification.

According to one aspect of the invention, a simulation device is provided for simulating a manufacturing process including a first processing step using a first mask, and a second processing step using a second mask. The simulation device includes first obtaining means for obtaining a first intensity distribution generated over a substrate of interest for processing by the first mask, second obtaining means for obtaining a second intensity distribution generated over the substrate by the second mask, and revising means for revising an intensity of a region in the first intensity distribution to be processed by the second mask, to a value regarded as a region not processed, based on the second intensity distribution.

According to another embodiment, a simulation device is provided for simulating a manufacturing process including a first processing step using a first mask, and a second processing step using a second mask. The simulation device includes first obtaining means for obtaining a first intensity distribution generated over a substrate of interest for processing by the first mask, second obtaining means for obtaining a second intensity distribution generated over the substrate by the second mask, and addition means for adding together the first and second intensity distributions quantized to thereby output an intensity distribution generated by the manufacturing process.

According to the above embodiments, the foregoing problems can be solved.

BRIEF DESCRIPTION OF THE DRAWINGS

FIGS. 5A and 5B are diagrams for explaining the comparison between the plurality of fabrication processes and a plurality of exposure processes;

FIG. 22 is a flowchart showing a procedure for lithography simulation according to a second embodiment;

DETAILED DESCRIPTION

Figure 1:
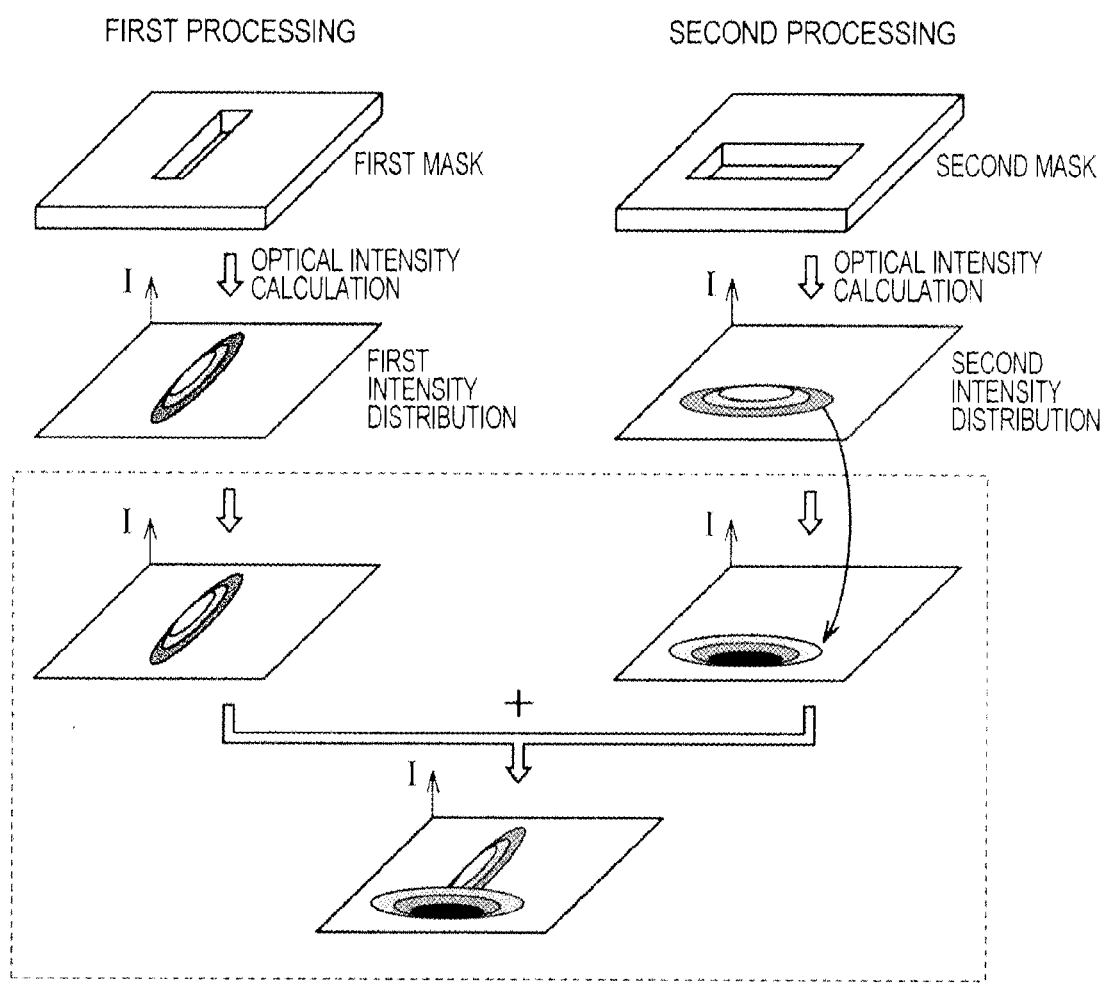
FIG. 1 is a diagram for explaining the outline of lithography simulation according to one preferred embodiment.

One or more preferred embodiments of the present invention will be described in detail below with reference to the accompanying drawings. The same or equivalent part in the figures is designated by the same reference character, and its description will not be repeated.

A. Outline

FIG. 1 shows a diagram for explaining the outline of lithography simulation according to one embodiment. The lithography simulation in this embodiment is performed on a manufacturing process which involves a first processing step (first processing) using a first mask, and a second processing step (second processing) using a second mask. Such a manufacturing process typically corresponds to a plurality of fabrication processes to be described later.

Referring to FIG. 1, in this embodiment, the use of the first mask provides a first intensity distribution (light energy intensity distribution) generated over a substrate (wafer) of interest to be processed, and the use of the second mask provides a second intensity distribution (light energy intensity distribution) generated over the substrate (wafer). The light energy intensity distributions are designed to determine the shape of wiring and the like to be formed over the wafer.

Now, a trim (removal) process will be described in which a part of the wiring formed by the first mask is removed using the second mask. In this case, regions where the second intensity distribution of superiority exists in wiring patterns determined based on the first intensity distribution does not remain as a final finish. Thus, attention should be paid to not all the first intensity distribution, but only a part of the first intensity distribution not trimmed by the second mask.

In this embodiment, the intensity of the region in the first intensity distribution to be processed by the second mask based on the second intensity distribution is revised to a value regarded as a region not processed. The simplest method is that the sign of the second intensity distribution is reversed and added to the first intensity distribution. Thus, only the region not trimmed by the second mask in the first intensity distribution remains as the part of priority of the intensity distribution, which can be used to effectively perform various types of processing.

In other words, according to this embodiment, in the manufacturing process of a semiconductor device involving a plurality of fabrication processes using the first and second masks, the intensity of the region formed by the first mask and trimmed (removed) by the second mask is calculated so as to be identified as the background in use of the first mask.

The term "region identified as the background" means a region having an intensity smaller than the threshold in use of a Dark_Field mask as the first mask, or a region having an intensity larger than the threshold in use of a Bright_Field mask as the first mask.

B. Simulation Device

<b1: Hardware Structure>

The lithography simulation device according to the one embodiment (hereinafter referred to as a simply "simulation device") is typically achieved by a computer-based device.

Figure 2:
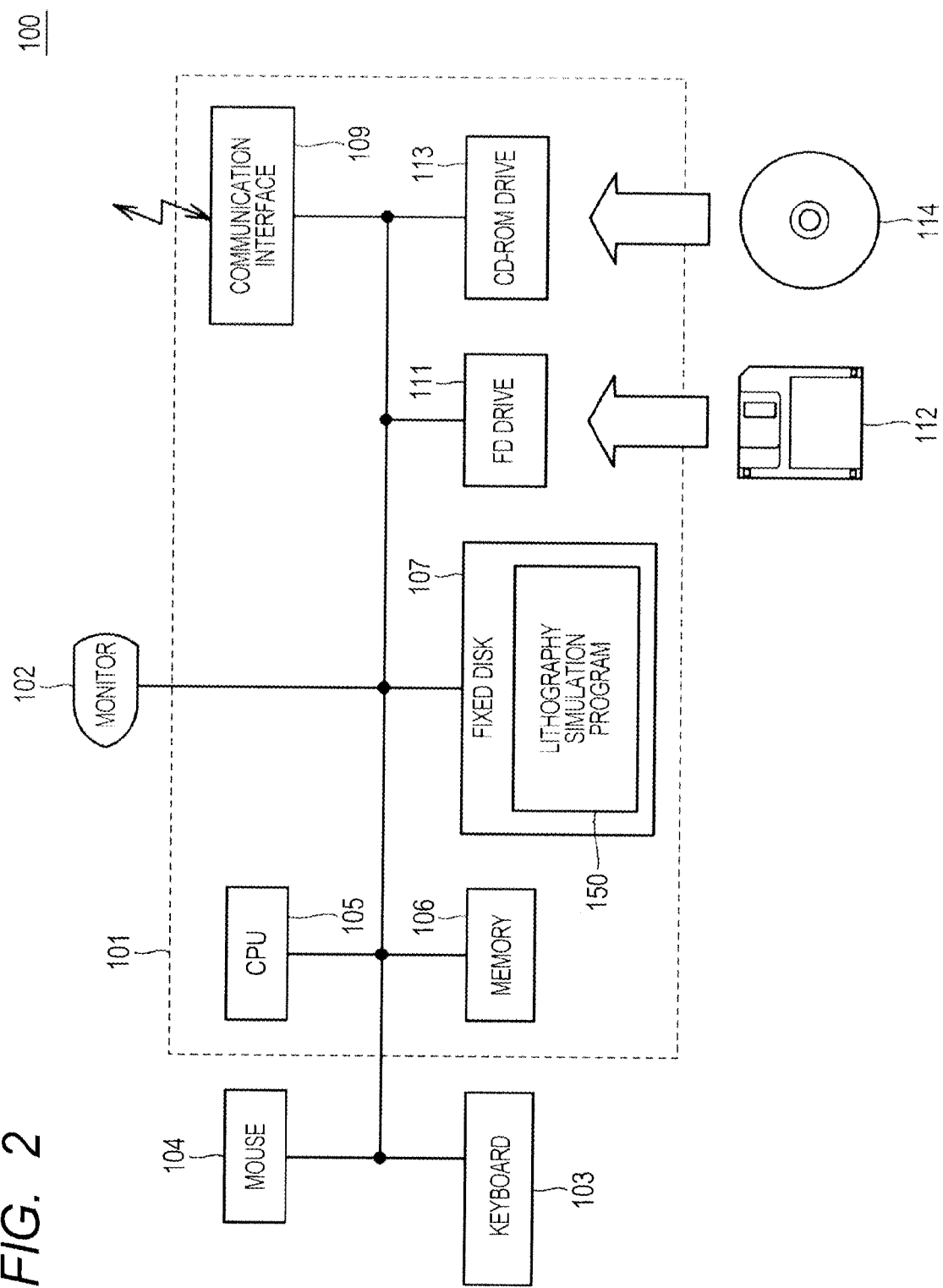
FIG. 2 is a configuration diagram schematically showing a typical hardware structure for achieving a lithography simulation device according to the one embodiment.

FIG. 2 shows a configuration diagram schematically showing a typical hardware structure for achieving the lithography simulation device according to the one embodiment. Referring to FIG. 2, a computer 100 for achieving the simulation device includes a computer main unit 101 with a flexible disk (FD) drive 111 and a compact disk-read only memory (CD-ROM) drive 113 mounted thereon, a monitor 102, a keyboard 103, and a mouse 104.

The computer main unit 101 includes, in addition to the FD drive 111 and the CD-ROM drive 113, a central processing unit (CPU) 105 as a computation section, a memory 106, a fixed disk 107 as a storing device, and a communication interface 109 which are coupled together by buses.

The simulation device works when the CPU 105 executes a lithography simulation program (hereinafter referred to as a simple "simulation program") 150 using a computer hardware, such as the memory 106. In general, such a simulation program 150 is stored in a recording medium, such as a FD 112 or a CD-ROM 114, or shared on a network or the like. The simulation program 150 is read from the recording medium by the FD drive 111 or CD-ROM drive 113 or the like, or received by the communication interface 109 to be stored in the fixed disk 107. Further, the simulation program 150 is read from the fixed disk 107 in the memory 106, and executed by the CPU 105.

The recording media for storing therein the simulation program 150 can include, in addition to the FD and CD-ROM, semiconductor recording media, such as a flash memory, a mask ROM, an electronically programmable read-only memory (EPROM), an electronically erasable programmable read-only memory (EEPROM), and an integrated circuit (IC) card; optical disk recording media, such as a digital versatile disk-read only memory (DVD-ROM); magneto-optical recording media, such as a magnetic optical disk (MO), and a mini disk (MD); and magnetic recording media, such as a magnetic tape and a cassette tape. Thus, when the simulation is performed using the simulation program 150, an instruction code itself read from the recording medium, or a recording medium itself with an instruction code stored therein forms the one embodiment.

The CPU 105 is a computation processing section for performing various types of numerical logical operations. The CPU achieves the above simulation by executing instruction codes in turn. At this time, the CPU 105 communicates with various components to execute the simulation program 150. For example, the memory 106 stores therein various kinds of information required for the CPU 105 to execute the instruction.

The monitor 102 is a display for displaying information output from the CPU 105, and is comprised of a liquid crystal display (LCD), and a cathode ray tube (CRT) by way of example. The monitor 102 displays the results of execution of the simulation program 150 and the like.

The mouse 104 receives a command corresponding to an operation, such as click or slide, from a user. The keyboard 103 receives the command corresponding to an input key, from the user.

The communication interface 109 is a device to establish communication between the computer 100 and other devices, and is capable of receiving various types of data from the outside.

The simulation device is not limited to the structure achieved by the single CPU (computation processor) shown in FIG. 2, and can also be achieved using a plurality of CPUs (computation processors). Alternatively, the simulation program 150 may be executed by communication between a plurality of computers. That is, the term "simulation device" as used in the present specification means not only a device consisting of a single computer, but also a system achieved by the communication between the computers.

The simulation device may also be achieved using a higher-level network, typified by the so-called cloud computing system. In this case, although the computers (server devices) of interest to be processed can be distributed, such a structure also corresponds to the "simulation device" described in the present specification.

Instead of the entire simulation program 150 itself achieving all functions required for the simulation, a process or module provided by an operation system (OS) or the like which is executed by the computer can be used to achieve the simulation.

The term "simulation program" as described in the present specification means not only an executable program which can be directly executed by the CPU 105, but also a source program, a compressed program, and a coded program.

The simulation device according to the one embodiment includes not only one achieved by a software, but also one whose part or all of which includes a hardware, such as a dedicated communication circuit.

<b2: Functional Module Structure>

Figure 3:
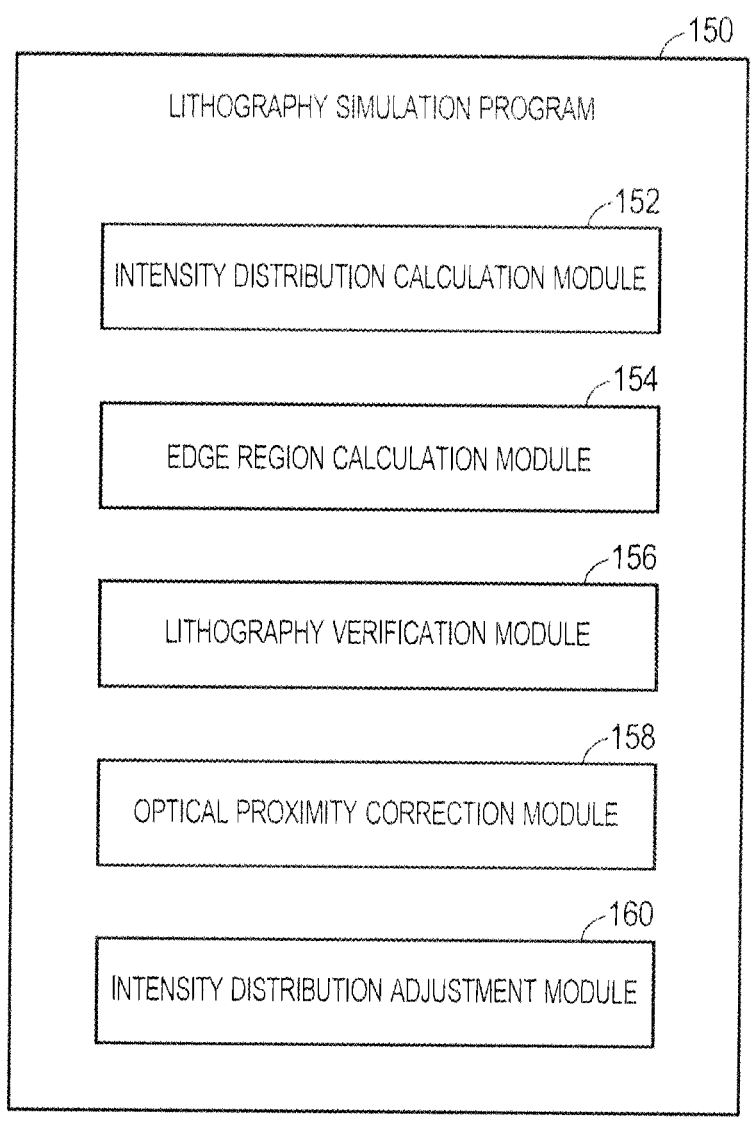
FIG. 3 is an exemplary diagram showing a functional module structure included in the lithography simulation device according to the one embodiment.

FIG. 3 is an exemplary diagram showing a functional module structure of the lithography simulation device according to the one embodiment. Referring to FIG. 3, the simulation program 150 to be executed by the simulation device includes an intensity distribution calculation module 152, an edge region calculation module 154, a lithography verification module 156, an optical proximity correction module 158, and an intensity distribution adjustment module 160, as a functional module. Other modules except for the intensity distribution calculation module 152 among the modules shown in FIG. 3 are to achieve any one of the preferred embodiments to be described later. Thus, all the modules shown in FIG. 3 are not necessarily included in the single simulation program 150.

The details of the processing executed by the respective modules will be described below.

C. Manufacturing Process of Interest to be Simulated

The lithography simulation device in one embodiment performs simulation on a manufacturing process involving a plurality of fabrication processes using different masks. That is, this embodiment is directed to the manufacturing process for manufacturing a semiconductor device by performing at least first processing using one mask and second processing using another mask on the same wafer. The present simulation involves calculating the shape (energy intensity distribution) produced over the wafer based on mask layout data indicative of the respective masks. Further, the simulation involves executing various types of lithography verification processing using the calculated shape (energy intensity distribution) over the wafer.

First, the manufacturing process involving the first processing step using one mask and the second processing step using another mask (hereinafter referred to as a "a plurality of fabrication processes") will be described below. By comparison, not only the plurality of fabrication processes, but also the plurality of exposure processes will also be described below.

Figure 4:
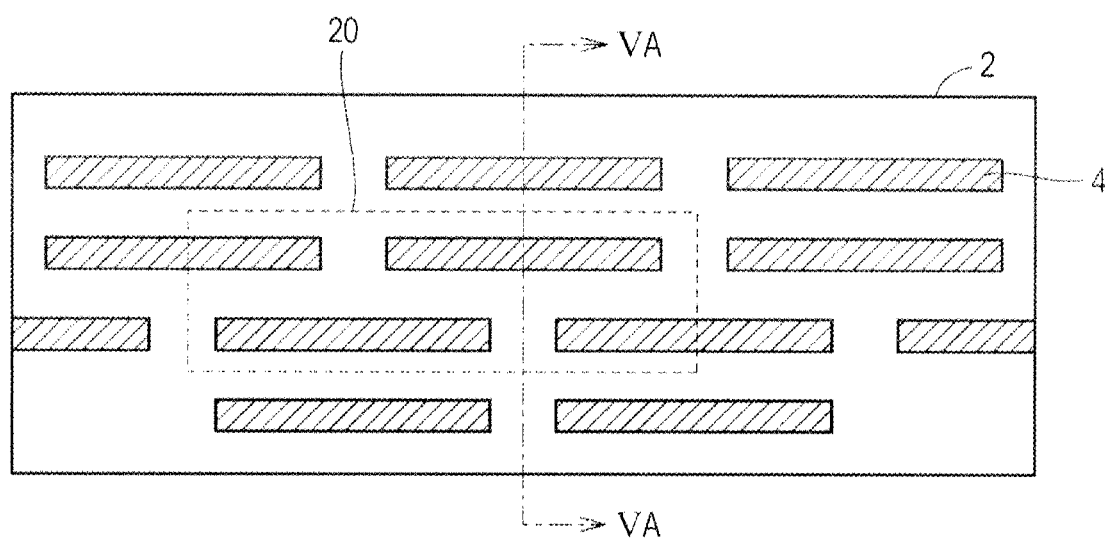
FIG. 4 is a diagram showing one example of a layout of a semiconductor device manufactured by a plurality of fabrication processes.

FIG. 4 is a diagram showing one example of a layout of a semiconductor device manufactured by the plurality of fabrication processes. FIGS. 5A and 5B are diagrams for explaining the comparison between the plurality of fabrication processes and the plurality of exposure processes.

Referring to FIG. 4, for example, suppose that the layout includes a plurality of conductive layers 4 formed over a substrate layer 2 in parallel to the horizontal direction with respect to the paper surface. As shown in FIG. 4, the position of separation of the conductive layers 4 in one row is shifted from that of the adjacent conductive layers 4 in another row, among the rows of the conductive layers 4.

FIG. 5A is a diagram for explaining the manufacturing process (the plurality of fabrication processes) for manufacturing the semiconductor device shown in FIG. 4. FIG. 5A focuses on a region 20 shown in FIG. 4. As shown in FIG. 5A, first, the conductive layer 4 is formed over the substrate layer 2, and further, a first resist 6 is formed thereover. The wafer is subjected to the first exposure using a first mask 201. The first mask 201, as shown in FIG. 5A, has a transparent mask part 8 and a light-resistant photomask part 10. Four rows of the conductive layers 4 are formed over the substrate layer 2 by the first exposure.

Subsequently, the first resist 6 is removed, and then a second resist 14 is formed over the substrate layer 2 and the conductive layer 4. Further, a second exposure process is performed using the second mask 202. As shown in FIG. 5A, the second mask 202 has another translucent mask part 8 and a light-resistant photomask part 12 formed therein. The second exposure removes two of the four conductive layers 4 previously formed. Finally, the second resist 14 is removed, whereby the semiconductor device shown in FIG. 4 is manufactured.

In contrast, as shown in FIG. 5B, in the plurality of exposure processes, the conductive layer 4 is formed over the substrate layer 2, and the wafer with the first resist 6 formed over the conductive layer 4 is subjected to the first exposure using the first mask 301. Subsequently, the second exposure is performed on the wafer using the second mask 302. Then, the first resist 6 is removed from the wiring patterns of the conductive layers 4 formed in this way, whereby the semiconductor device with four rows of the conductive layers 4 formed thereover is manufactured.

As described above, in the plurality of exposure processes, the same resist is subjected to a plurality of times of exposure using the masks, and then developed and etched. In contrast, in the plurality of fabrication processes, the first resist 6 is exposed, developed, and etched using the first mask 201. Thereafter, the second resist 14 newly applied is exposed, developed, and etched using the second mask 202.

For simplifying the description, the simulation for a plurality of fabrication processes including two processing steps will be described below. However, obviously, a plurality of processes including three or more processing steps can also be applied in the same way as will be described later.

Typically, the plurality of fabrication processes is suitably applied to a trim (removal) process shown in FIGS. 5A and 5B, but not limited thereto. The plurality of fabrication processes can also be applied to a process for forming wirings over a wafer in two stages.

D. Related Art

<d1: Single Processing Step>

The related art will be described in advance before the description of the simulation method according to the one embodiment. First, a simulation method for a single fabrication process, and not a plurality of fabrication processes, will be described below.

Figure 6:
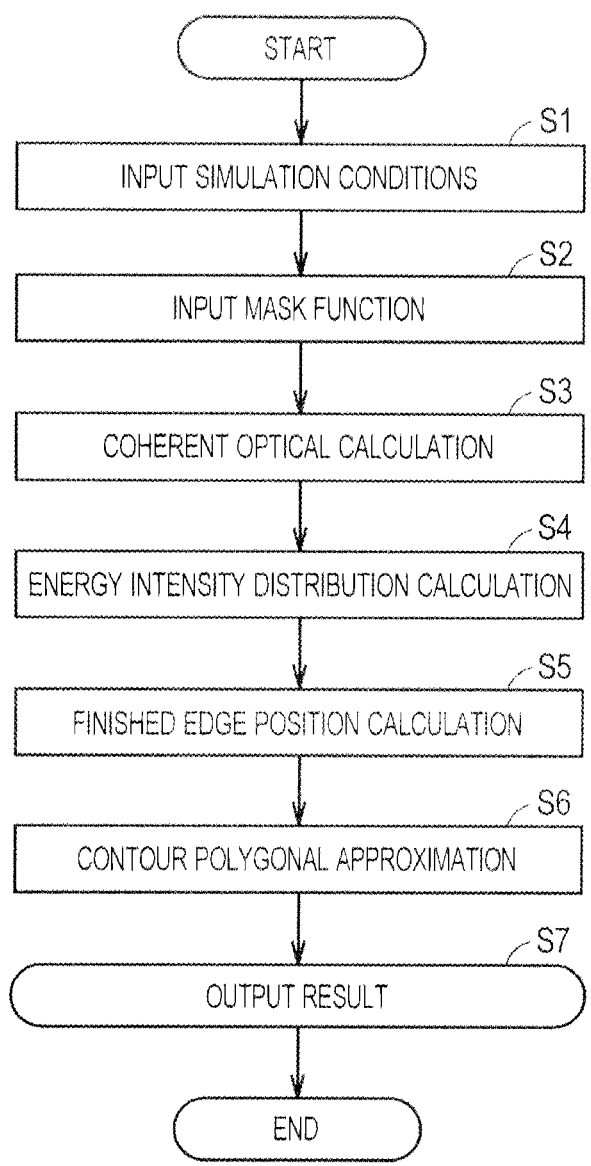
FIG. 6 is a flowchart showing a procedure for lithography simulation in the related art.
Figure 7:
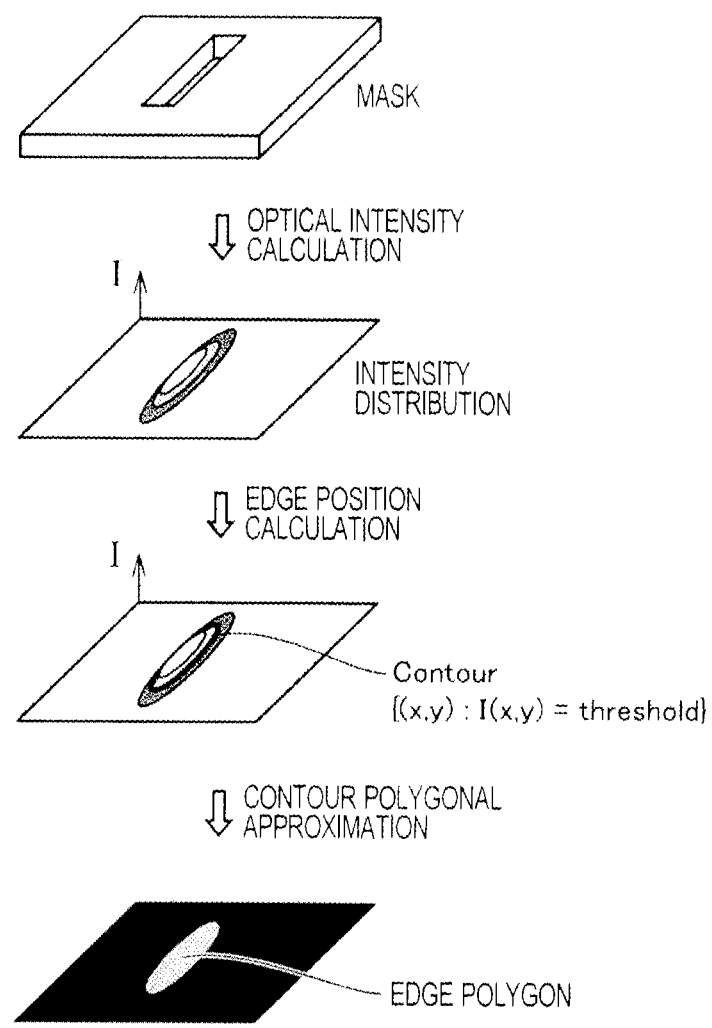
FIG. 7 is a diagram for explaining the contents of processing corresponding to FIG. 6.

FIG. 6 is a flowchart showing the procedure of lithography simulation in the related art. The respective steps shown in FIG. 6 are achieved by causing the CPU 105 of the computer 100 to execute the simulation program. FIG. 7 is a diagram for explaining the contents of processing corresponding to FIG. 6.

Referring to FIG. 6, first, the CPU 105 receives inputs of simulation conditions (in step S1). The simulation conditions include parameters (exposure wavelength, illumination conditions, a numerical aperture, and the like) regarding the exposure device, and resist characteristic values to be applied. Subsequently, the CPU 105 receives an input of a mask function indicative of the shape of masks to be used (in step S2). The mask function is a general function using a transmitted light as an output corresponding to a light incident on each position of the mask of interest to be simulated. In steps S1 and S2, parameters regarding the mask shown in FIG. 7 and an exposure device for exposure using the mask are set.

Subsequently, the CPU 105 performs coherent optical calculation based on the input parameter conditions and mask function (in step S3), and then performs an energy intensity distribution calculation (in step S4). That is, the CPU 105 calculates optical behaviors under the conditions input, and as a result, calculates the energy intensity distribution formed over the wafer. By such an optical intensity calculation, a light energy intensity distribution to be formed over the wafer is obtained as shown in FIG. 7. Further, the same calculation process provides a threshold distribution (threshold (x,y)). The threshold distribution is calculated as a function indicative of a value in each position, like the energy intensity distribution.

Subsequently, the CPU 105 calculates a finished edge position with respect to the energy intensity distribution calculated in step S4 (step S5). Thus, a Contour (contour line) indicative of the shape of the edge formed over the wafer is calculated as shown in FIG. 7. The term "Contour" as used herein means a collection of points whose energy intensity is identical to the threshold (x, y) representing resist characteristics (or etching characteristics). Generally, the Contour is a closed curve.

In this way, the finished edge position calculation (in step S5) includes a process for specifying the position of the edge by comparing the energy intensity distribution 214 obtained by correcting the energy intensity distribution 211 with the predetermined threshold distribution.

Subsequently, the CPU 105 performs a contour polygonal approximation on the calculated Contour (in step S6). Thus, the border of the "Contour" is approximated as a polygon. Finally, the CPU 105 outputs an edge polygon as a result of the contour polygonal approximation (in step S7). That is, as shown in FIG. 7, the edge polygon is obtained. The output forms of the edge polygon may include the form that allows the user to see and identify, and the form that is output in the way available in the following step to be described later.

In this way, in the contour polygonal approximation (in step S6), the specified edge position is approximated as the polygon, which outputs the edge polygon indicative of the contour of the region formed over the wafer.

As mentioned above, the simulation conditions and the mask shapes (mask function) are input, so that the edge polygon is output as the result of the simulation.

Remarkably, the above simulation method can achieve the processing from steps S1 to S5 by a matrix operation using a sampling theorem. That is, since the wavelength properties of light can be used, a matrix defined with a relatively coarse interval can be used to effectively perform the processing with the sufficient accuracy.

In contrast, in steps after the contour polygonal approximation (step S6), it is necessary to calculate the polygon (region enclosed by a curved line) represented according to the accuracy required in the output result. For example, in the steps S1 to S5, a matrix calculation of a grid level required for the sampling theorem according to the simulation conditions (for example, calculation performed on grids with a gap of several tens of nm) is enough. In contrast, the following steps including step S6 need the accuracy of a level of about one hundredth of the grid gap (0.1 nm) required for the sampling theorem. That is, calculation is required on a polygon comprised of a number of apexes represented on the grid which requires 100 times higher accuracy in each axis.

Figure 8:
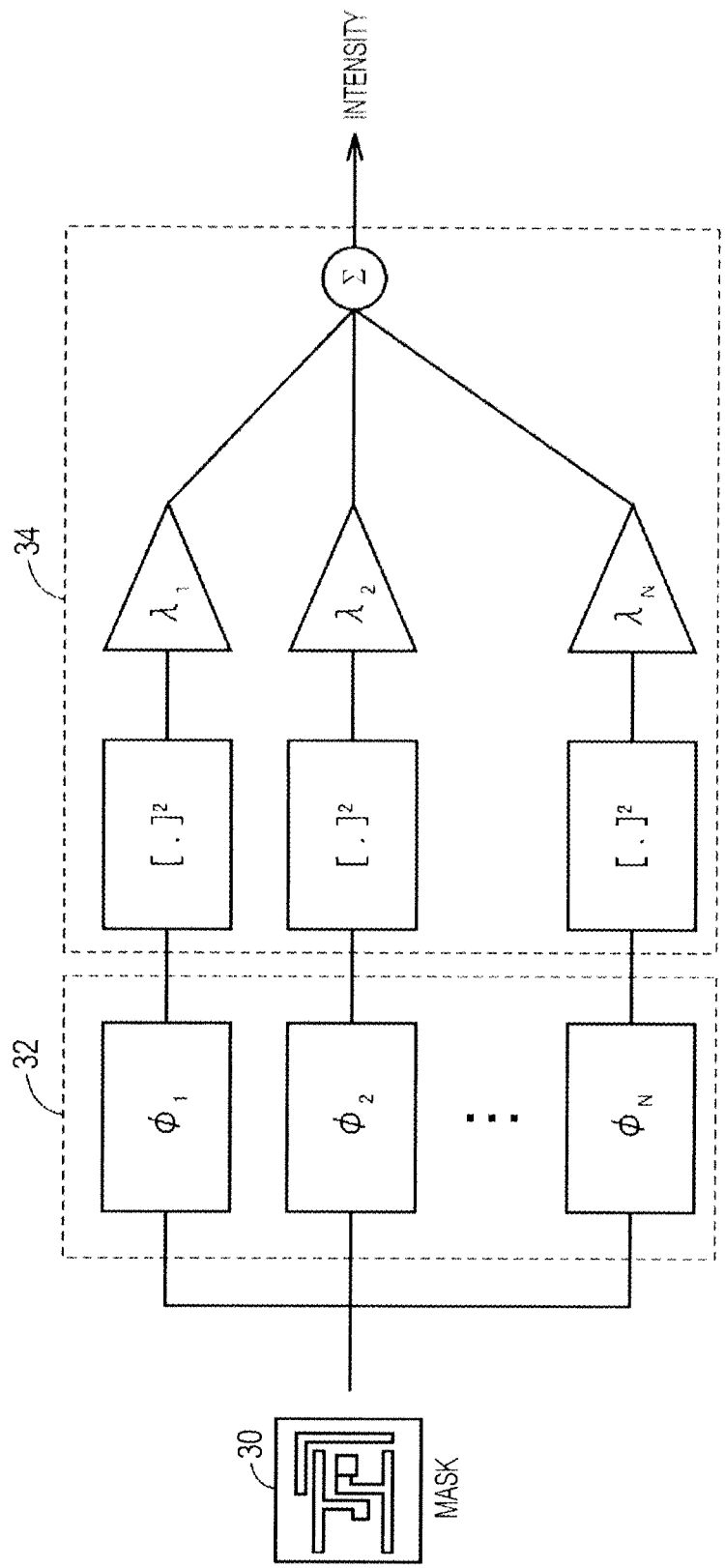
FIG. 8 is a diagram for explaining the contents of coherent optical calculation, energy intensity distribution calculation, and energy intensity distribution calculation which are shown in FIG. 6.

The processing until step S5 will be described in more detail below. FIG. 8 shows a diagram for explaining the contents of the coherent optical calculation, the energy intensity distribution calculation, and the energy intensity distribution calculation which are shown in FIG. 6. Referring to FIG. 8, first, each of wavelength components $\phi1$ to $\phi N$ (a complex number indicative of an intensity and a phase) is calculated with respect to a mask function 30 indicative of the shape of a mask (module 32). At this time, an approximate calculation is performed using a coherent optical system. Thus, a perturbation calculation which involves addition/subtraction of only fluctuations (perturbations) by use of a complex number (intensity and phase) can be used. That is, since the result obtained before the conditions are fluctuated can be re-used, the amount of operation for calculating the result obtained after the conditions are fluctuated can be decreased.

Subsequently, the energy intensities for the respective wavelength components are added together (module 34). An addition processing corresponding to a partial coherent optical system is performed. Since information on the phase is lacking at this time, the following processing cannot use the perturbation calculation.

For more detailed contents, see Reference Cited 1 (Nick Cobb, "Sum of Coherent Systems Decomposition by SVD", Department of Electrical Engineering and Computer Science, University of California at Berkeley, Berkeley, Calif., U.S.A., Sep. 21, 1995).

As described above, in the following steps after the contour polygonal approximation (step S6), the information on phase is lacking, and thus the effective calculation cannot be carried out. Thus, in many cases, an algorism using the energy intensity and the threshold distribution are employed in lithography verification or an optical proximity correction (OPC) process (hereinafter referred to as an "OPC process") included in the lithography simulation.

Figure 9:
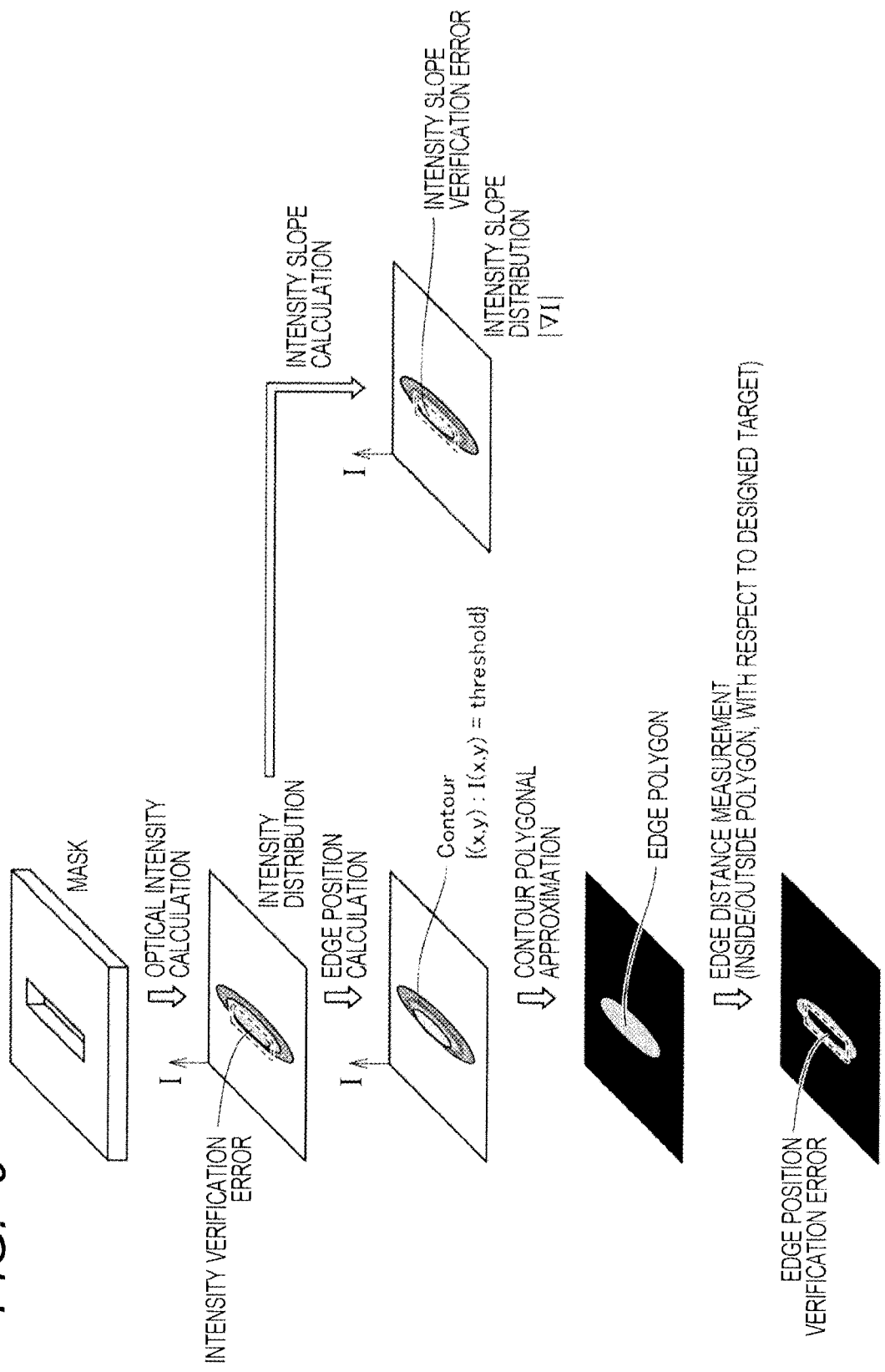
FIG. 9 is a diagram for explaining the contents of a lithography verification process using the lithography simulation shown in FIG. 7.
Figure 10:
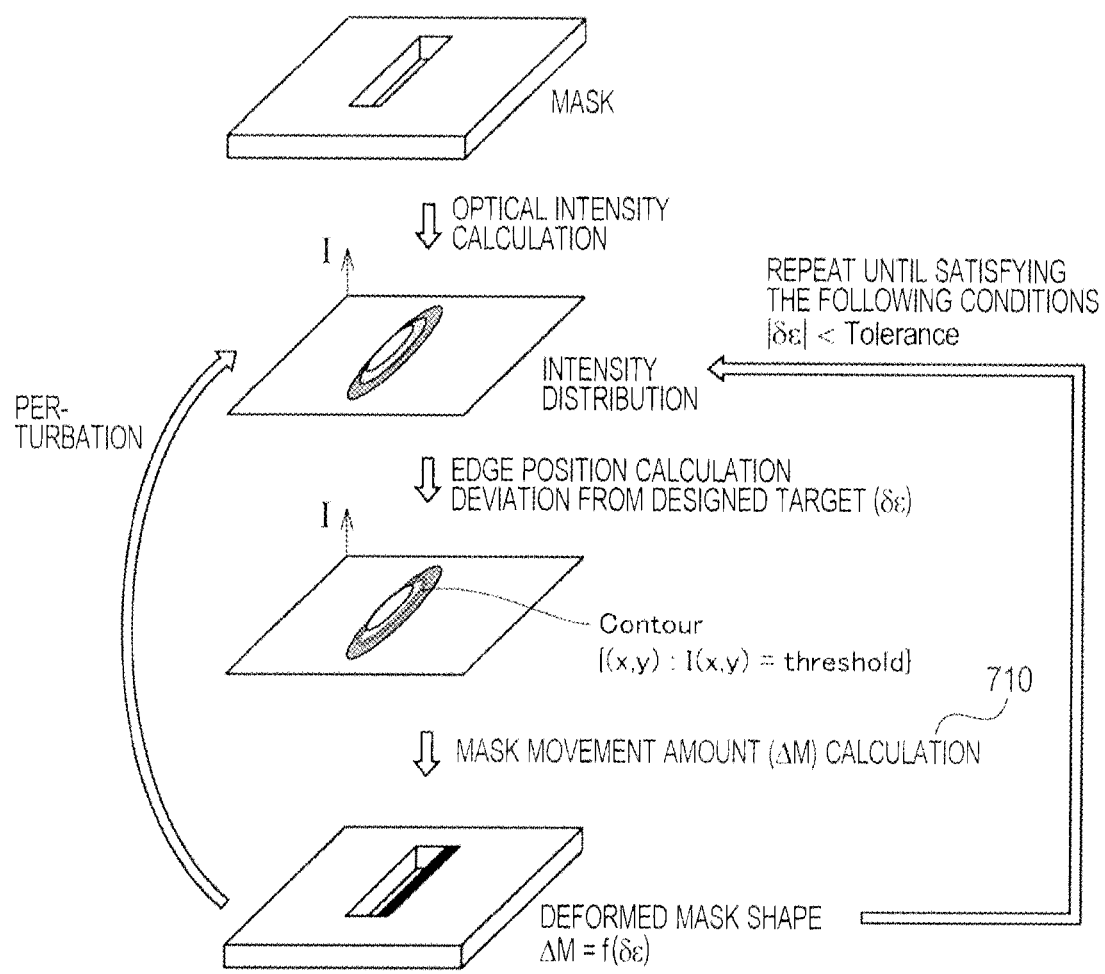
FIG. 10 is a diagram for explaining the contents of an OPC process using the lithography simulation shown in FIG. 7.

FIG. 9 is a diagram for explaining the contents of the lithography verification using the lithography simulation shown in FIG. 7. FIG. 10 is a diagram for explaining the contents of the OPC process using the lithography simulation shown in FIG. 7.

Referring to FIG. 9, the lithography verification includes a verification (intensity verification) of the energy intensity distribution, a verification (intensity slope verification) of a slope of the energy intensity distribution (intensity slope distribution), a verification (edge position verification) of an edge position based on an edge polygon generated, and a verification (distance verification) of a distance between opposed edges of the edge polygon. In the edge position verification, distances of the inside and outside of the generated polygon from the target (designed target) are evaluated. In this way, in the respective verification processes, different types of simulation results are used.

Referring to FIG. 10, the OPC process involves evaluating the pattern formed using one mask, and correcting the mask such that the formed pattern is within a target value. More specifically, the energy intensity distribution and the corresponding edge position formed over the wafer using the mask are obtained, which evaluates a deviation ($\delta\epsilon$) from the designed target. The shape of the mask is changed based on the deviation ($\delta\epsilon$) from the designed target calculated. Specifically, an amount of displacement from the present mask (mask displacement amount $\Delta M=f(\delta\epsilon)$) is calculated. And, the energy distribution intensity due to the deformed mask shape is calculated. At this time, the perturbation calculation can be used taking into consideration only the amount of a change in mask movement amount $\Delta M$.

Such a series of processing is repeated such that a deviation ($\delta\epsilon$) from the designed target is equal to or less than a predetermined tolerance (Tolerance). The repeated calculation or computation is sometimes performed together with the verification of the intensity and the intensity slope.

<d2: Plurality of Fabrication Processes>

Next, the simulation method for the plurality of fabrication processes using the above related art technique will be described below.

Figure 11:
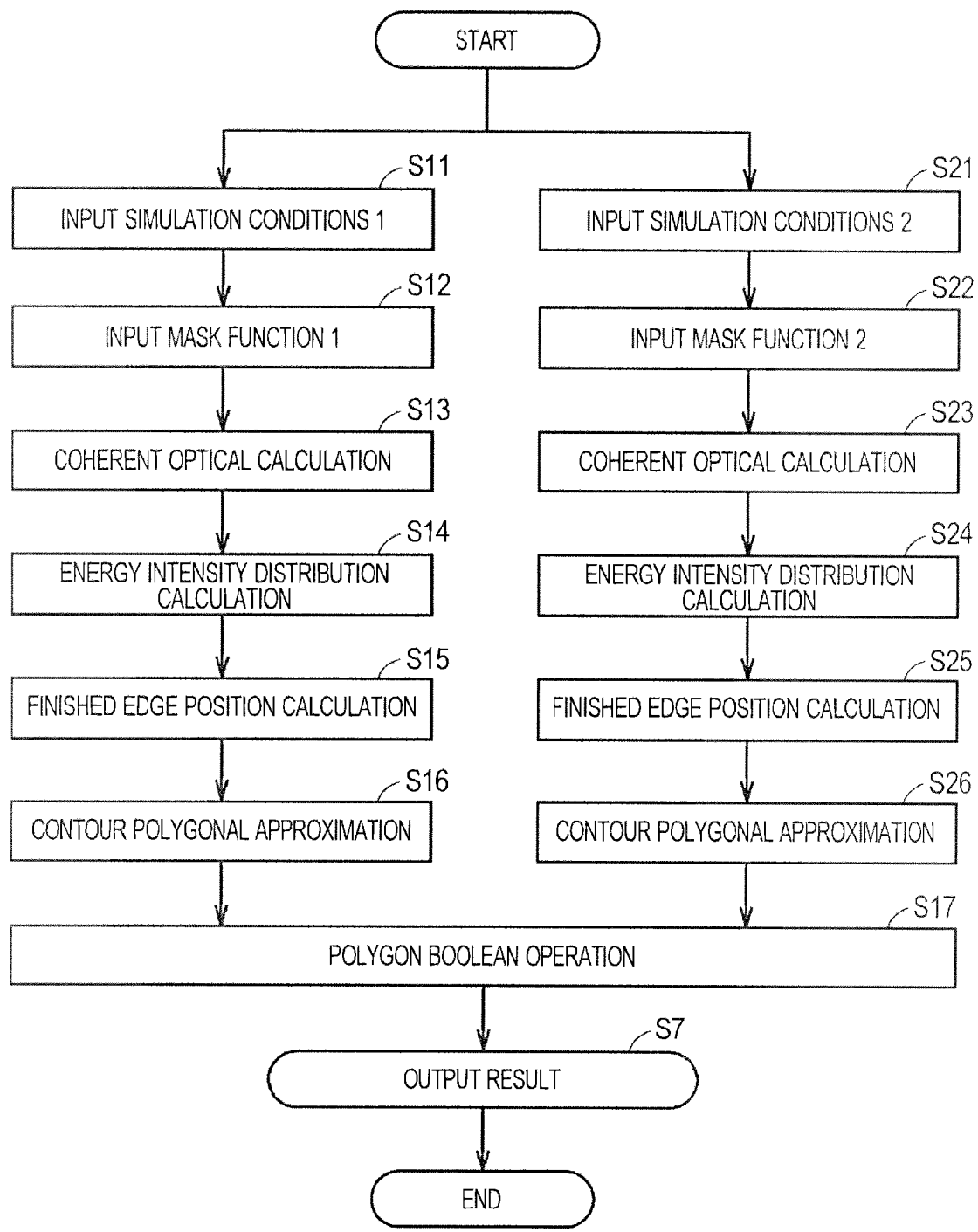
FIG. 11 is a flowchart showing a procedure for lithography simulation in the related art.
Figure 12:
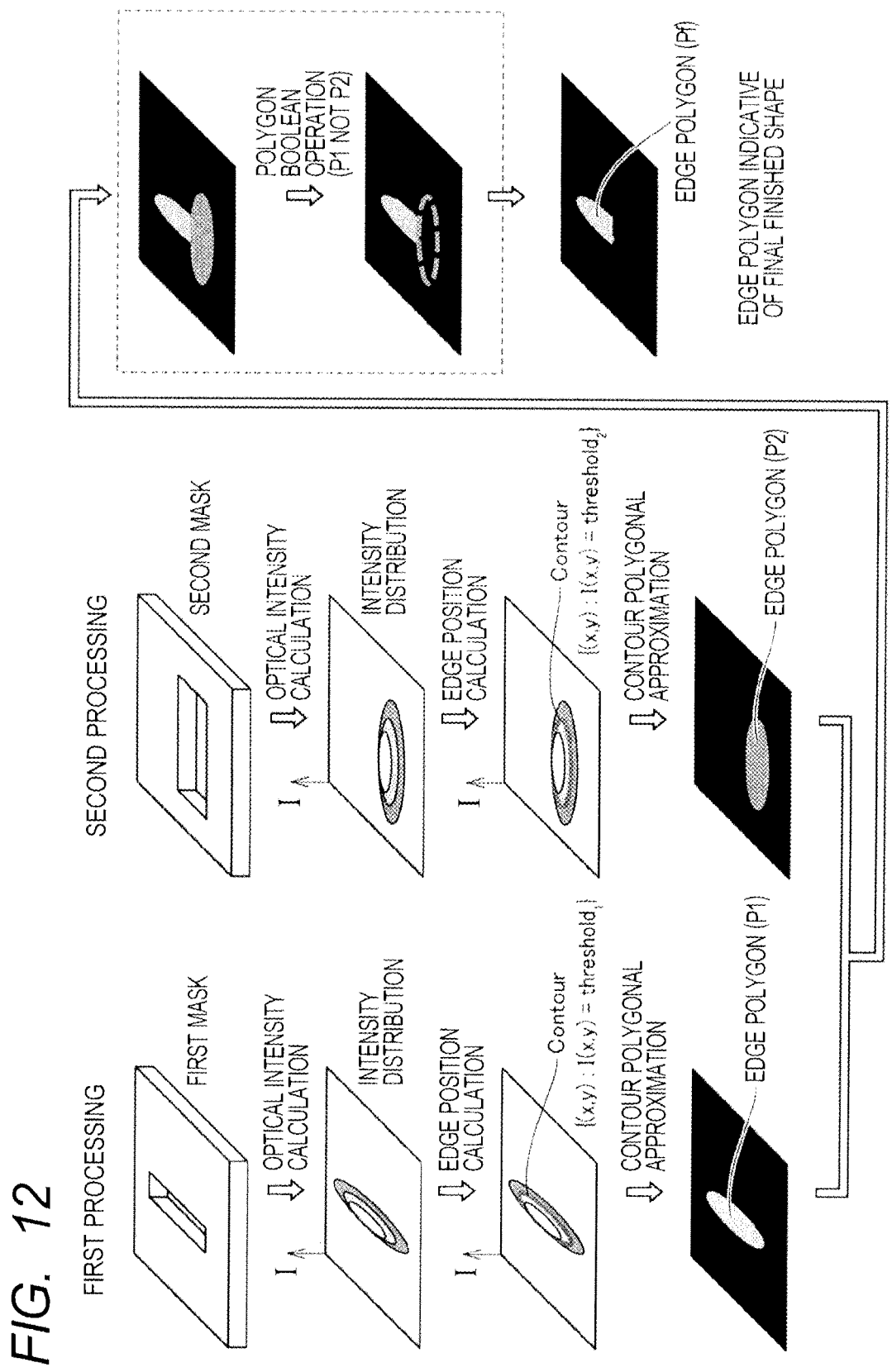
FIG. 12 is a diagram for explaining the contents of the processing corresponding to FIG. 11.

FIG. 11 is a flowchart showing the procedure of the lithography simulation in the related art. The CPU 105 of the computer 100 executes the simulation program to achieve the respective steps shown in FIG. 11. FIG. 12 is a diagram for explaining the contents of processing corresponding to FIG. 11.

Referring to FIG. 11, in performing the simulation on the plurality of fabrication processes, first, the respective steps of the above series of processing from steps S1 to S6 shown in FIG. 6 are independently performed. As shown in FIG. 12, the first processing using the first mask involves an input of simulation conditions (in step S11), an input of a mask function 1 (in step S12), coherent optical calculation (in step S13), energy intensity distribution calculation (in step S14), finished edge position calculation (in step S15), and contour polygonal approximation (in step S16). In parallel to or series to this processing, the second processing using the second mask involves an input of simulation conditions (in step S21), an input of a mask function 2 (in step S22), coherent optical calculation (in step S23), energy intensity distribution calculation (in step S24), finished edge position calculation (in step S25), and contour polygonal approximation (in step S26).

As a result of the processing, an edge polygon (hereinafter referred to as a "P1") to be obtained by the first processing and another edge polygon (hereinafter referred to as a "P2") to be obtained by the second processing are calculated. Subsequently, the CPU 105 executes a polygon Boolean operation on these edge polygons (in step S17). When the plurality of fabrication processes are executed for the trim process shown in FIG. 5A, an "NOT Operation" is performed as the polygon Boolean operation. That is, as shown in FIG. 12, the Boolean operation called (P1 NOT P2) is performed between the edge polygon (P1) obtained by the first processing and the edge polygon (P2) obtained by the second processing. The result of the operation is output as a last edge polygon (hereinafter referred to as a "Pf").

As can be seen from the comparison between FIG. 6 and FIG. 11, when the above related art technique is applied to the plurality of fabrication processes, the polygon Boolean operation is required for the edge polygons. As mentioned above, each edge polygon is represented by a polygon (consisting of a number of apexes) expressed by the high-accuracy grid, which results in high load on the process for executing the polygon Boolean operation.

The result of the plurality of fabrication processes is represented by only the edge polygon (Pf) which is a result of the polygon Boolean operation. Thus, any means for performing the lithography verification and the OPC process at high speed, which are performed in the single fabrication process, cannot be employed.

Figure 13:
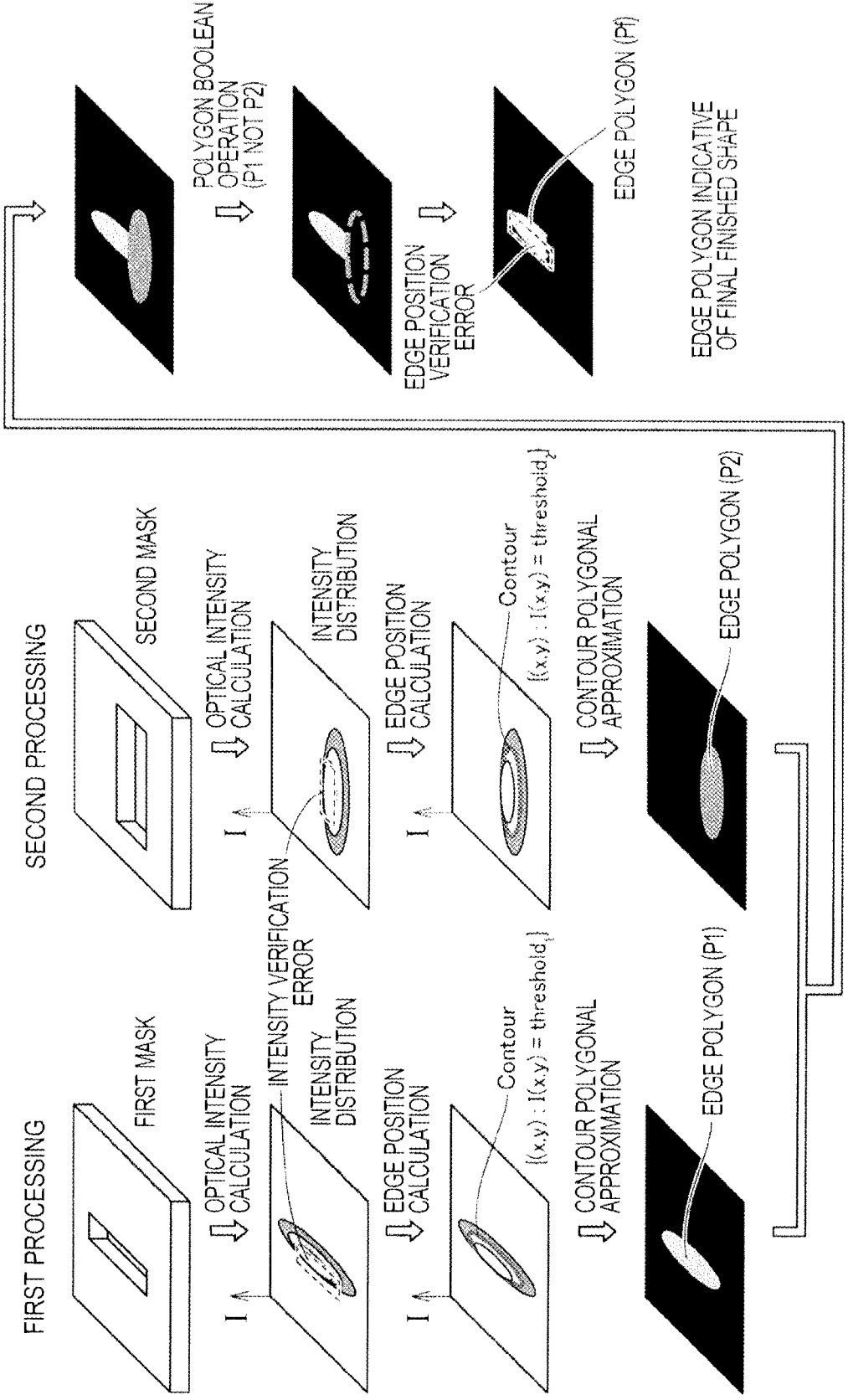
FIG. 13 is a diagram for explaining the contents of a lithography verification process using the lithography simulation shown in FIG. 12.
Figure 14:
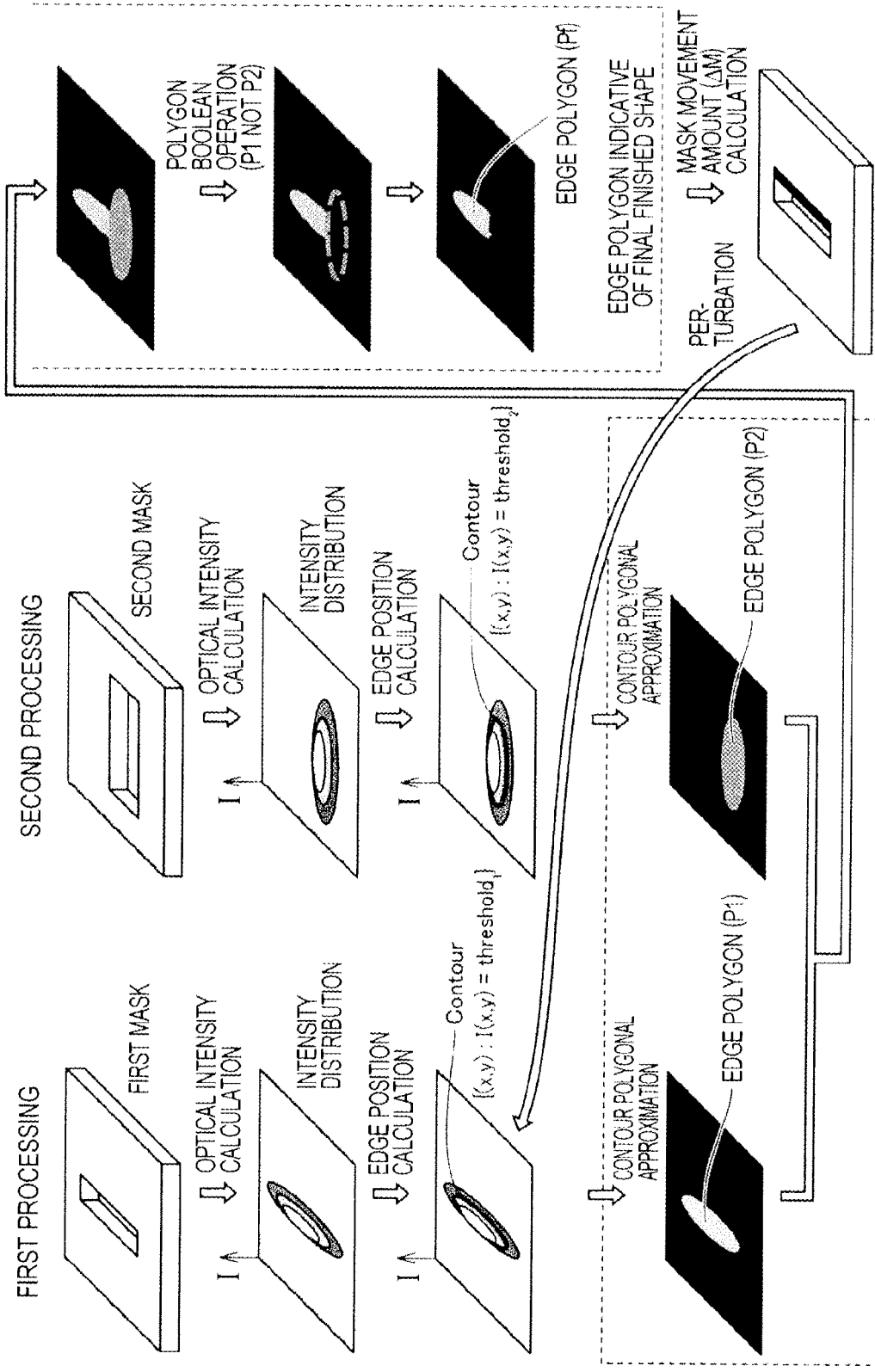
FIG. 14 is a diagram for explaining the contents of an OPC process using the lithography simulation shown in FIG. 12.

FIG. 13 is a diagram for explaining the contents of the lithography verification process using the lithography simulation shown in FIG. 12. FIG. 14 is a diagram for explaining the contents of the OPC processing using the lithography simulation shown in FIG. 12.

As shown in FIG. 13, the verification process (intensity verification) for the energy intensity distribution can be carried out in each processing step, but cannot be performed taking into consideration the result of the plurality of fabrication processes. That is, a part not trimmed in a region formed by the first processing remains as a final finish, but a part trimmed by the second processing does not affect the final finish. Thus, even when there is any part determined to be an error by the intensity verification or intensity slope verification, if the part is to be trimmed in the second process, the final finish does not have any problems. Similarly, in the second processing, a part except for parts actually trimmed does not affect the final finish. Thus, even when there is any part determined to be an error by the intensity verification or intensity slope verification, if the part is not practically trimmed, the final finish does not have any problem.

In this way, when the lithography verification process is performed on each processing step, a part not affecting the final finish might be detected as a dummy error. In order to avoid such a dummy error, the removal or confirmation of the dummy error imposes loads on the device.

The verification process (edge position verification) of the edge position based on the generated polygon needs to use not the high-speed edge position measurement performed by comparison between the intensity distribution and the threshold distribution, but the result of the polygon Boolean operation with a high processing load.

As shown in FIG. 14, in performing the OPC process, the perturbation calculation can be used for the shape of the mask. The final object of interest to be evaluated needs to use the edge polygon (Pf), which is the result of the polygon Boolean operation with the high processing load. That is, the contour polygonal approximation and the polygon Boolean operation are repeated by the number of times required for the OPC process.

In this way, when the above related art technique is applied to the plurality of fabrication processes, the way to omit the finished edge position calculation or the contour polygonal approximation, which can be used in the single fabrication process, cannot be used. Thus, in performing the lithography verification or the OPC process, the total processing time is increased.

Since the plurality of fabrication processes differs from the single fabrication process in procedure for the lithography verification and the OPC process, an existing simulation program (simulation device), or a processing flow of applications (including lithography verification or model based OPC) using the simulation program must be changed.

E. First Embodiment

Next, the lithography simulation according to a first embodiment will be described below.

e1: Procedure

Figure 15:
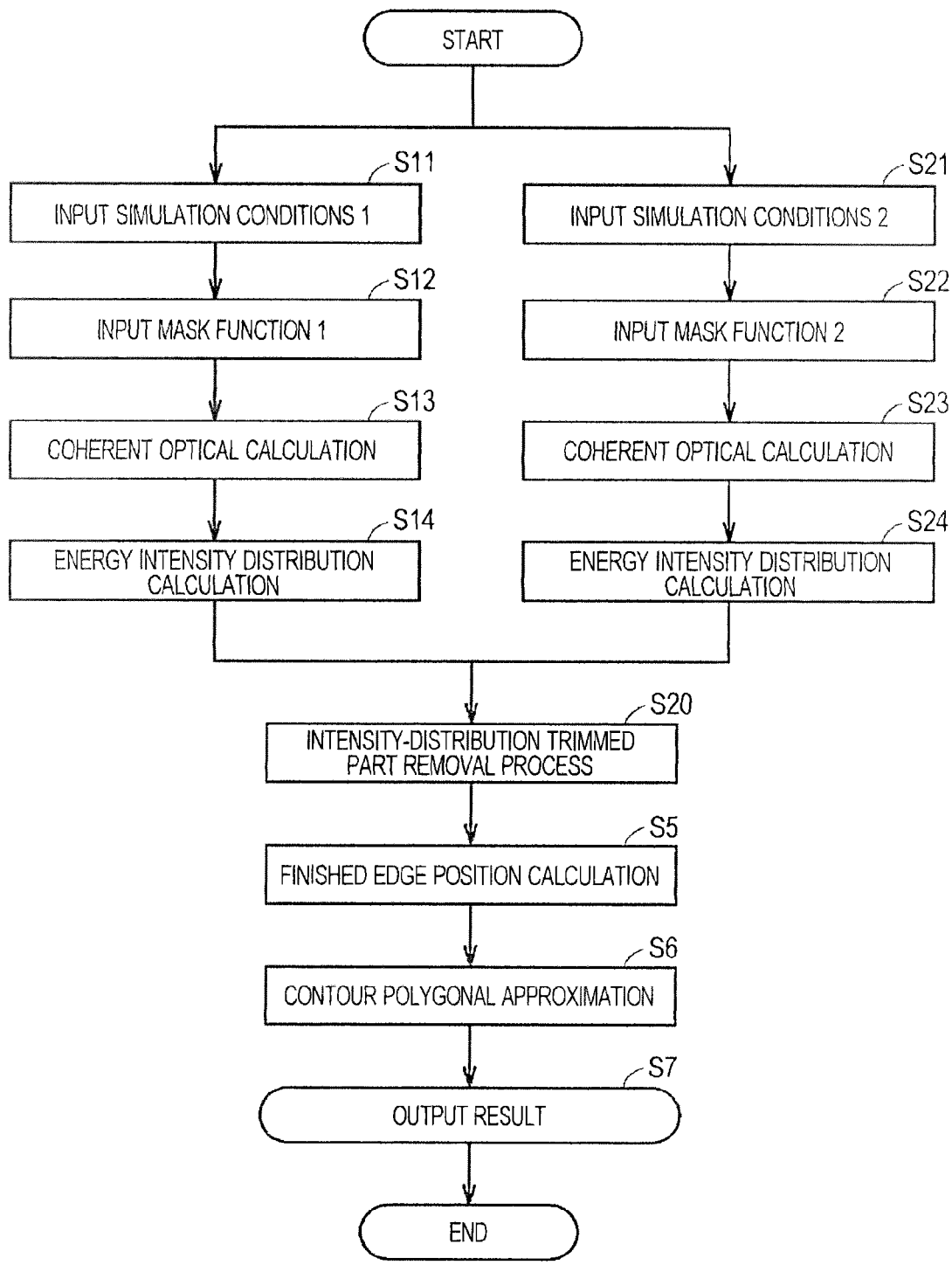
FIG. 15 is a flowchart showing a procedure for lithography simulation according to a first embodiment.
Figure 16:
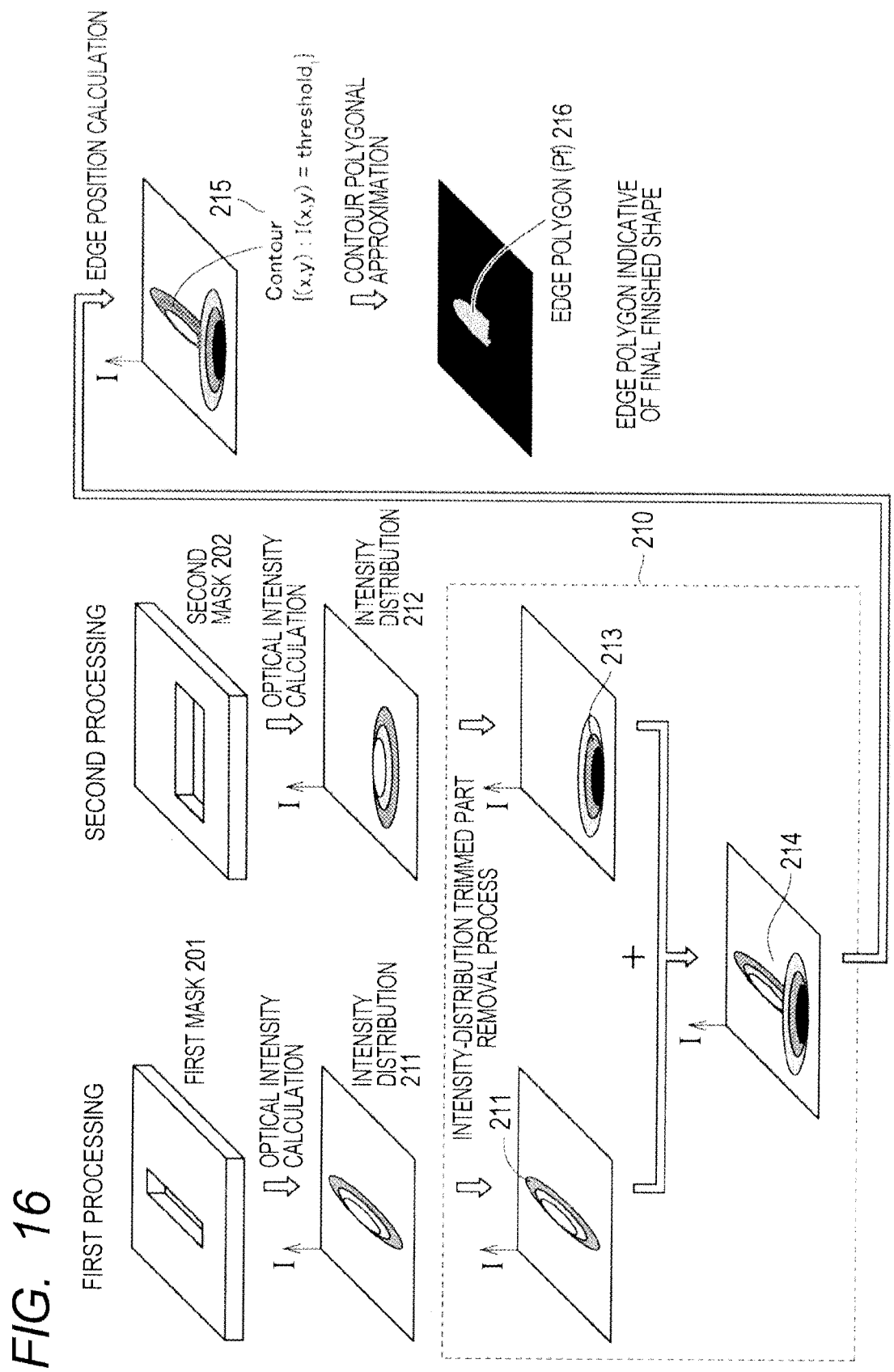
FIG. 16 is a diagram or explaining the contents of processing corresponding to FIG. 15.

FIG. 15 is a flowchart of the procedure for lithography simulation according to the first embodiment. The CPU 105 of the computer 100 executes a simulation program to achieve each step shown in FIG. 15. FIG. 16 shows a diagram for explaining the contents of processing corresponding to FIG. 15.

The procedure shown in FIG. 15 does not include the polygon Boolean operation (in step S17) included in the procedure shown in FIG. 11. Instead, a trimmed part removal process of the intensity distribution (in step S20) is executed. Then, after execution of the intensity-distribution trimmed part removal process (in step S20), the finished edge position calculation (in step S5) and the contour polygonal approximation (in step S6) are executed.

More specifically, the CPU 105 calculates an energy intensity distribution 211 generated by the first mask 201 (in steps S11 to S14). The processes in steps S11 to S14 are provided by an intensity distribution calculation module 153 (see FIG. 3). That is, the CPU 105 receives the input of the simulation conditions 1 using the first mask 201 (in step S11), and also receives the input of the mask function 1 indicative of the shape of the first mask 201 to be used (in step S12). Subsequently, the CPU 105 performs the coherent optical calculation (in step S13) based on the parameter conditions 1 and mask function 1 input, and then performs the energy intensity distribution calculation (in step S14). Through steps S11 to S14, an energy intensity distribution 211 corresponding to the first mask 201 is obtained as shown in FIG. 16.

Similarly, the CPU 105 calculates an energy intensity distribution 212 generated by the second mask 202 (in steps S21 to S24). The processes from steps S21 to S24 are provided by the intensity distribution calculation module 152 (see FIG. 3). That is, the CPU 105 receives the input of the simulation conditions 2 using a second mask 202 (in step S21), and also receives the input of a mask function 2 indicative of the shape of the second mask 202 used in step S22. Subsequently, the CPU 105 performs the coherent optical calculation (in step S23) based on the parameter conditions 2 and mask function 2 input, and then performs the energy intensity distribution calculation (in step S24). Through steps S21 to S24, the energy intensity distribution 212 corresponding to the second mask 202 is obtained as shown in FIG. 16.

The contents of the processes in the respective steps described above have been described using FIGS. 6 and 11, and a detailed description thereof will not be repeated.

Subsequently, the processes in steps S20, S5, S6, and S7 are executed. These processes are provided by the edge region calculation module 154 (see FIG. 3).

More specifically, the CPU 105 first executes the intensity-distribution trimmed part removal process (in step S20). The trimmed part removal process involves revising the intensity of a region to be processed by the second mask 202 in the energy intensity distribution 211 provided by the first mask 201, to a value regarded as a region not processed based on the energy intensity distribution 212 for the second mask 202.

In a specific processing example of such a trimmed part removal process of an intensity distribution (revising process) 210, the sign of the energy intensity distribution 212 corresponding to the second mask 202 is reversed and added to the energy intensity distribution 211 corresponding to the first mask 201. Specifically, as shown in FIG. 16, in using the mask having a light-resistant photomask part as a base and a trimmed part as the translucent mask part in the second processing, the energy intensity distribution 212 will be converted into the negative. That is, the energy intensity distribution 213 having an opposite characteristic value to the energy intensity distribution 212 is used to calculate an energy intensity distribution 214.

Alternatively, after normalization to be described later, the energy intensity distribution 212 for the second mask 202 may be subtracted from the energy intensity distribution 211 for the first mask 201.

Another intensity-distribution trimmed part removal process (revising process) 210 may specifically replace a value of a part (element of an array corresponding thereto) of the energy intensity distribution 211 within a threshold boundary between the distribution 211 and the energy intensity distribution 212 for the second mask 202, by a fixed background value by way of example. In other words, the intensity-distribution trimmed part removal process in step S20 involves specifying the shape of the edge by comparison between the energy intensity distribution 212 and a predetermined threshold distribution, and by replacing the value corresponding to the inside of the edge whose shape is specified in the energy intensity distribution 211, by another intensity regarded as the background.

By the intensity-distribution trimmed part removal process (in step S20), the energy intensity distribution 214 corresponding to the final finish generated by the plurality of fabrication processes of interest is thus obtained.

Subsequently, the CPU 105 calculates a finished edge position based on the energy intensity distribution 214 obtained in step S20 (in step S5). Thus, as shown in FIG. 16, a Contour 215 indicative of the shape of the edge formed over the wafer is calculated. Further, the CPU 105 performs the contour polygonal approximation on the calculated Contour 215 (in step S6). Thus, the outline of the Contour 215 is approximated as the polygon. Finally, the CPU 105 outputs an edge polygon (Pf) 216 as a result of the contour polygonal approximation (in step S7). That is, the edge polygon 216 shown in FIG. 16 is obtained. The output forms of the edge polygon 216 include the form that the user can view and identify, and the form that can be output in the way available in the next step to be described later. The edge polygon 216 indicates the shape of the final finish obtained through the plurality of fabrication processes of interest.

The next step uses various types of electronic design automation (EDA) tools, a wafer pattern shape estimation tool (viewer) by means of simulation, and the like.

As shown in FIG. 15, the intensity-distribution trimmed part removal process (in step S20) is performed before the contour polygonal approximation (in step S6). As mentioned above, before the execution of the contour polygonal approximation (step S6), a matrix operation using a matrix defined with a relatively coarse interval can be performed by means of the sampling theorem. Thus, the processing can be effectively carried out, which does not lead to an increase in processing loads even in simulating the plurality of fabrication processes.

By comparing the procedure according to the first embodiment with the procedure in which the related art lithography simulation shown in FIG. 6 is applied to the single fabrication process, the procedure of the first embodiment differs from the related-art procedure only in that the intensity-distribution trimmed part removal process (in step S20) is additionally executed, except that the mask functions are input. For this reason, a speeding-up means widely used in the related art can be used as it is. Thus, a software appropriate for the plurality of fabrication processes can be easily developed without largely changing the existing software asset. That is, the energy intensity distribution 214 output by the intensity-distribution trimmed part removal process (in step S20) is output together with the threshold distribution, which can effectively perform the OPC process and the lithography verification without performing the contour polygonal approximation.

e2: Intensity-Distribution Trimmed Part Removal Process

Now, the detailed contents of the intensity-distribution trimmed part removal process (in step S20) shown in FIG. 15 will be described below. As mentioned above, the first embodiment does not use the approximated polygon, and performs a matrix operation directly using the energy intensity distributions 211 and 212, which can provide the virtual energy intensity distribution 214 through the plurality of fabrication processes.

As shown in FIG. 16, the Contour 215 indicative of the edge shape and the edge polygon 216 are calculated from the energy intensity distribution 214. The amplitudes of the energy intensity distributions 211 and 212 may be appropriately adjusted (that is, intensity adjustment) according to the ratio between the amplitudes of both the distributions (or the ratio between the thresholds thereof).

In a typical example of the intensity-distribution trimmed part removal process shown in FIG. 16, after adjusting the intensity of the energy intensity distribution 211 in the first processing, the energy intensity distribution 212 generated in the second processing is subtracted from or added to the adjusted energy intensity distribution 211 to thereby determine the energy intensity distribution 214. More specifically, the energy intensity distribution 212 generated in the second processing is converted into the negative, and then is added. Thereafter, by comparing the energy intensity distribution 214 obtained by the subtraction or addition with the threshold corresponding to the first processing, the Contour 215 is calculated.

By way of another example, the intensity-distribution trimmed part removal process shown in FIG. 16 may use a Contour for the second processing which is calculated or determined by comparing the energy intensity distribution 212 generated by the second processing with the threshold corresponding to the second processing. More specifically, the intensity of an element of the energy intensity distribution 211 generated in the first processing and located in the region inside the Contour generated by the second processing is replaced with an intensity regarded as the background in the first processing. The region inside the Contour in the second processing is a part or area of the energy intensity distribution 212 generated by the second processing, and having an intensity more than the threshold corresponding to the second processing.

In FIG. 16, a part having a higher intensity than that of the threshold corresponding to the first processing in the energy intensity distribution 211 generated in the first processing has the shape of the final shape. Thus, the intensity regarded as the background in the first processing is set to a value lower than the threshold, for example, "0". In the first processing, the threshold corresponding to the first processing may be applied to the energy intensity distribution 214 calculated by replacement with the intensity regarded as the background, thereby determining the shape of the Contour finally obtained.

e3: Matrix Operation

The energy intensity distribution 214 shown in FIG. 16 can be calculated using a matrix defined with a relatively coarse interval. Specifically, such a matrix operation is as follows.

For example, a matrix element (intensity) of the energy intensity distribution 211 generated in the first processing is designated as $a_{ij}$, and a matrix element (intensity) of the energy intensity distribution 212 generated in the second processing is designated as $b_{ij}$. Another matrix element of the threshold corresponding to the energy intensity distribution 212 is designated as a threshold $d\_b_{ij}$. In this case, the matrix operation involves comparing the matrix element $b_{ij}$ with the matrix element threshold_$b_{ij}$ in all combinations of i and j. For $b_{ij} \geq $ threshold_$b_{ij}$, a corresponding matrix element $a_{ij}$ is set to "0". For $b_{ij} < $ threshold_$b_{ij}$, a value of the corresponding matrix element $a_{ij}$ is maintained as it is (not changed).

FIG. 16 shows an example in which a region having an intensity higher than that of the threshold is identified as the shape of the final finish over the wafer. In contrast, when a region having an intensity lower than that of the threshold is identified as the shape of the final finish over the wafer, a magnitude relationship between the intensity distribution and the threshold may be opposite to that described above. More specifically, the intensity regarded as the background in the first processing is set to a value higher than the threshold, for example, "1".

Even when the magnitude relationship between the intensity distribution of the region indicative of the shape of the wafer finish and the threshold differs between the first processing and the second processing, the same can go for that case.

In this way, the energy intensity distributions 211 and 212 are respectively defined as a matrix with a common grid interval. Alternatively, the relationship between the elements is interpolated, which leads to conversion into the common grid interval. And, the intensity-distribution trimmed part removal process (in step S20) shown in FIG. 15 includes the operations of the matrixes corresponding to the energy intensity distributions 211 and 212.

e4: Application Example

Now, an example in which the above lithography simulation is actually applied will be described.

Figure 17:
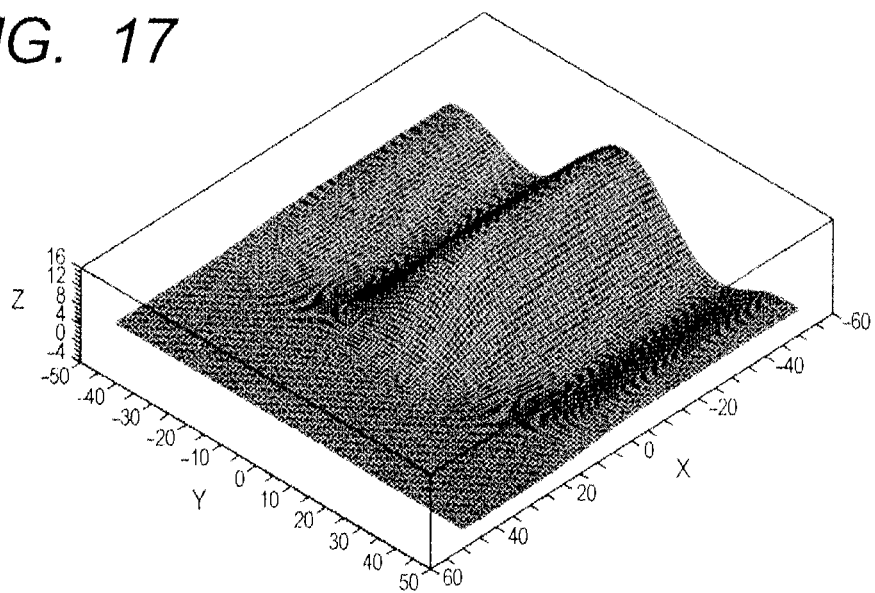
FIG. 17 is a diagram showing an example of energy intensity distribution corresponding to a first mask and calculated by the lithography simulation according to the first embodiment.
Figure 18:
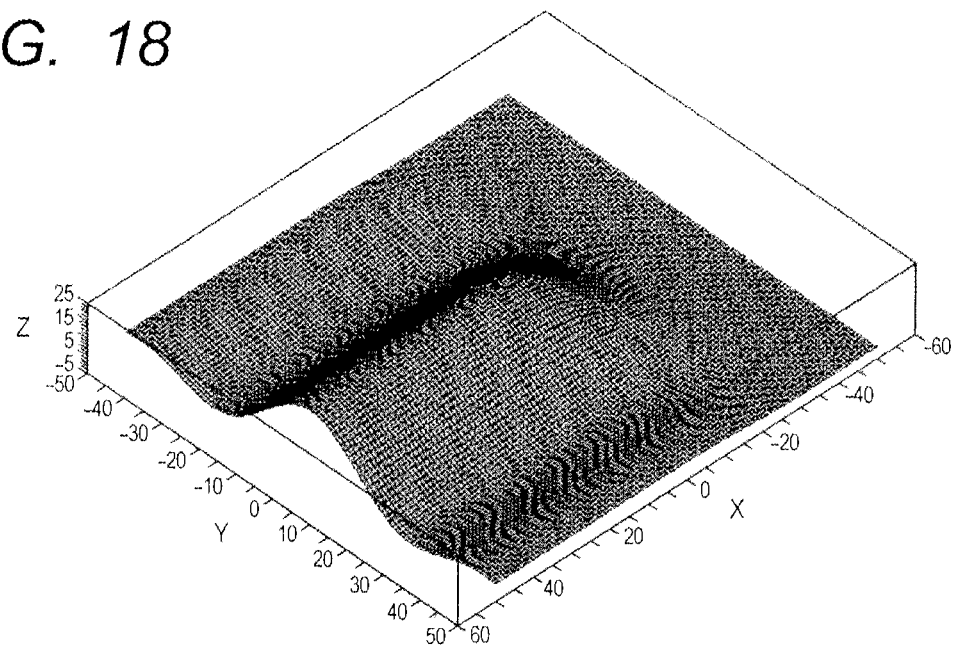
FIG. 18 is a diagram showing another example of energy intensity distribution corresponding to a second mask and calculated by the lithography simulation according to the first embodiment.
Figure 19:
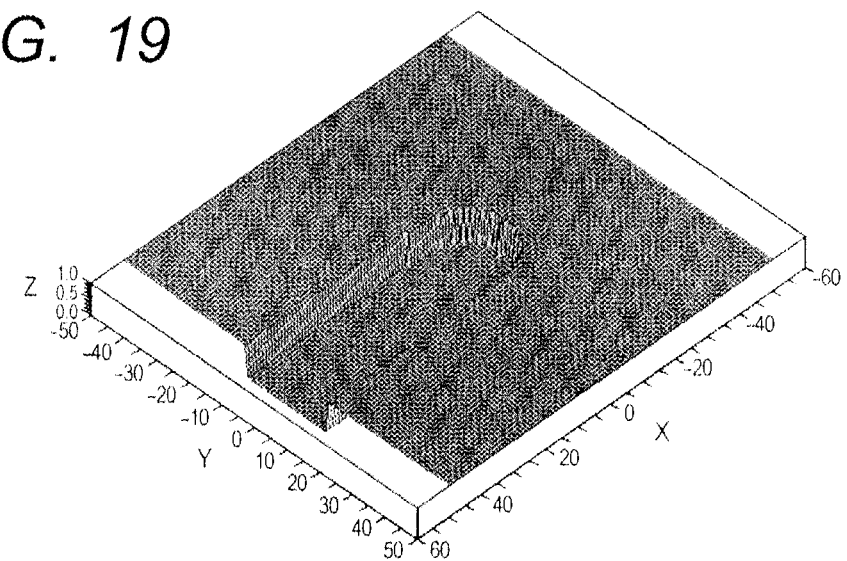
FIG. 19 is a diagram showing the result of quantizing the energy intensity distribution shown in FIG. 18 by a threshold.
Figure 20:
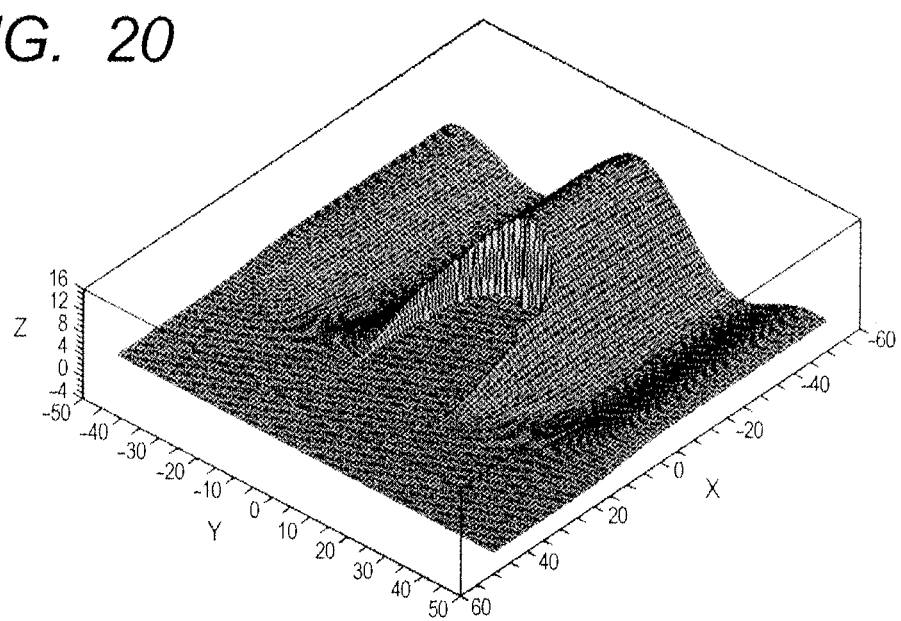
FIG. 20 is a diagram showing the result of a trimmed part removal process of the intensity distribution, using the energy intensity distribution shown in FIG. 17 and the quantized energy intensity distribution shown in FIG. 19.
Figure 21:
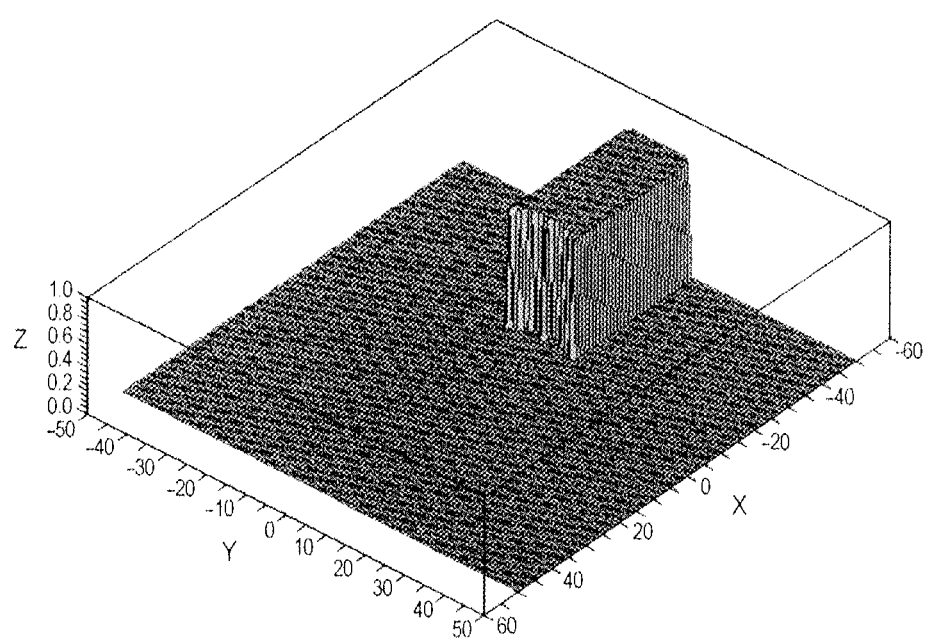
FIG. 21 is a diagram showing the result of quantizing the energy intensity distribution shown in FIG. 20 by another threshold.

FIG. 17 is a diagram showing an example of the energy intensity distribution corresponding to the first mask 201 calculated in the lithography simulation according to the first embodiment. FIG. 18 is a diagram showing an example of the energy intensity distribution corresponding to the second mask 202 calculated in the lithography simulation according to the first embodiment. FIG. 19 shows the result of quantizing the energy intensity distribution shown in FIG. 18 by a threshold. FIG. 20 is a diagram showing the result of the intensity-distribution trimmed part removal process, using the energy intensity distribution shown in FIG. 17 and the quantized energy intensity distribution shown in FIG. 19. FIG. 21 is a diagram showing the result of quantizing the energy intensity distribution shown in FIG. 20 by another threshold.

The energy intensity distributions shown in FIGS. 17 and 18 are respectively calculated using the mask functions respectively indicative of the first mask 201 and the second mask 202. As described above, the energy intensity distribution generated in the second processing shown in FIG. 18 may be reversed (converted into the negative), and then may be added to the energy intensity distribution generated in the first processing shown in FIG. 17. FIG. 19 shows the result of quantization of the energy intensity distribution generated in the second processing by way of example. That is, in the example shown in FIG. 19, the intensity of a part to be trimmed (part to serve as a background) in the energy intensity distribution shown in FIG. 18 is set to "0", and the intensity of the remaining parts is set to "1".

FIG. 20 illustrates the result of a matrix operation of the energy intensity distribution shown in FIG. 17 (matrix having the intensities in respective positions of the coordinates as elements) and the quantized energy intensity distribution shown in FIG. 19 (matrix having the intensities (each designated as "0" or "1") in respective positions of the coordinates). That is, as a result, the multiplication of the respective elements between the matrixes is obtained. FIG. 21 shows an energy intensity distribution obtained after the quantization of the energy intensity distribution shown in FIG. 20 by comparison with the corresponding threshold. That is, the part having a higher intensity than that of the threshold is identified as the Contour indicative of the edge polygon.

e5: Advantages

In the first embodiment, the plurality of fabricating processes (typically, trim process) can be simulated without performing a graphic operation using a polygon indicative of the outline of the Contour as an input, which can reduce the processing time. That is, the first embodiment does not require the polygon Boolean operation, which is necessary in the related art lithography simulation described above.

The processing flow of the existing simulation program (simulation device), or applications (including lithography verification, model base OPC, and the like) using the simulation program can be applied to the plurality of fabrication processes as they are, which can reduce the number of steps for development of the application, and can also achieve the high-speed processing.

F. Second Embodiment

Next, the lithography simulation according to a second embodiment will be described below. In the second embodiment, the lithography verification using the above-mentioned lithography simulation of the first embodiment will be described below.

<<f1: Procedure>>

Figure 23:
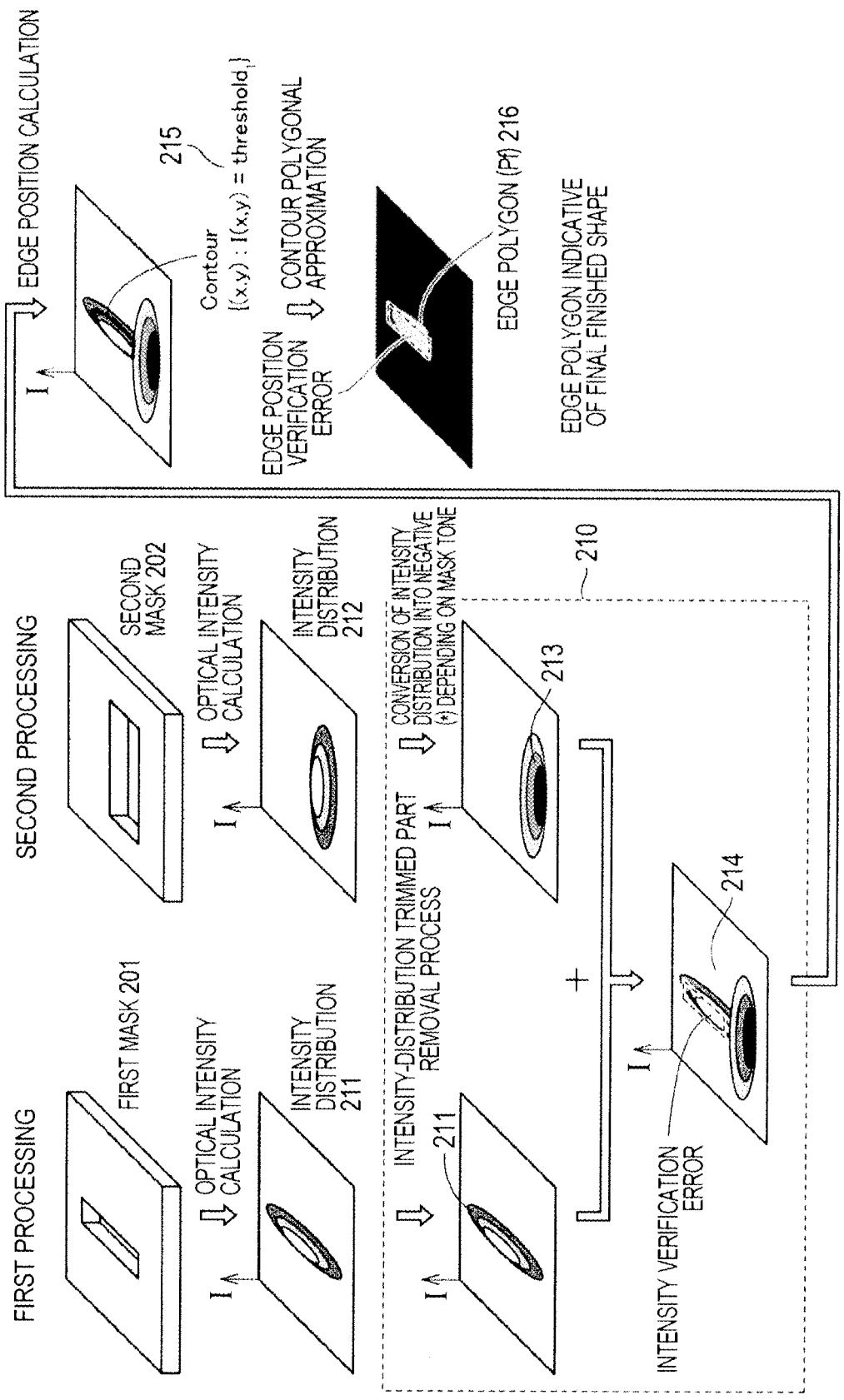
FIG. 23 is a diagram for explaining the contents of processing corresponding to FIG. 22.

FIG. 22 is a flowchart showing the procedure for the lithography simulation according to the second embodiment. More specifically, FIG. 22 shows the procedure for the lithography verification corresponding to the plurality of fabrication processes. The CPU 105 of the computer 100 executes the simulation program to achieve each step shown in FIG. 22. FIG. 23 is a diagram for explaining the contents of processing corresponding to FIG. 22.

In comparison with the procedure of the above first embodiment (flowchart shown in FIG. 15), the flowchart shown in FIG. 22 differs from the above procedure of the first embodiment in addition of intensity verification (intensity error determination) (in step S31), intensity slope distribution calculation (in step S32), intensity slope verification (intensity slope error determination) (in step S33), finished edge distance calculation (in step S41), edge position verification (edge distance error determination) (in step S42), polygon side distance calculation (in step S51), and distance verification (polygon side distance error determination) (step S52). Further, in step S9, a verification error detected by the lithography verification is output. Such an addition or changing process is provided by the lithography verification module 156 (see FIG. 3).

The same process as that included in the flowchart of FIG. 15 is designated by the same reference character, and a detailed description thereof will not be repeated.

That is, FIG. 22 shows the example of executing the lithography verification. The lithography verification includes a verification process (intensity verification) for the energy intensity distribution, another verification process (intensity slope verification) for an slope of the energy intensity distribution (intensity slope distribution), another verification process (edge position verification) for an edge position based on a generated polygon, and another verification process (distance verification) for a distance between sides of the polygon based on the generated polygon.

[i: Intensity Verification/Intensity Slope Verification]

Referring to FIGS. 22 and 23, the intensity verification (in step S31) and the intensity slope verification (in steps S32 and S33) are executed based on the energy intensity distribution 214 generated by the intensity-distribution trimmed part removal process (in step S20).

In the intensity verification (in step S31), the CPU 105 compares the energy intensity distribution 214 obtained by execution of the process in step S20 with a predetermined verification reference value. Based on the magnitude relationship therebetween, it is determined whether there is an intensity error or not. When there is the intensity error, the CPU 105 outputs a verification error including the position (coordinates) of the intensity error (in step S9). In this way, the lithography verification includes a process for verifying the presence or absence of an error by comparing at least one of the level of the intensity and the intensity slope of the energy intensity distribution 214 obtained by correcting the energy intensity distribution 211, with the verification reference value corresponding thereto.

In the intensity slope distribution calculation (in step S32), the CPU 105 calculates the slope of the energy intensity distribution (intensity slope distribution) from the energy intensity distribution 214 obtained by the execution of the process in step S20. The CPU 105 compares the calculated intensity slope distribution with a predetermined verification reference value. Based on the magnitude relationship therebetween, it is determined whether there is any intensity slop error or not (in step S33). When there is the intensity slope error, the CPU 105 outputs the verification error including the position (coordinates) of the intensity slope error (in step S9).

[ii: Edge Position Verification]

Referring to FIGS. 22 and 23, the edge position verification was executed (in steps S41 and S42) based on the edge shape (Contour 215) generated by the finish edge position calculation (in step S5). More specifically, in the finished edge distance calculation (in step S41), the CPU 105 calculates a distance (edge distance) between the position of a designed target and a finished edge position calculation by the simulation. And, the CPU 105 compares the calculated edge distance with a predetermined verification reference value. Based on the magnitude relationship therebetween, it is determined whether there is an edge distance error or not. When there is the edge distance error, the CPU 105 outputs a verification error including the position (coordinates) of the edge distance error (in step S9).

In this way, the lithography verification calculates the edge distance between the specified edge position and the designed target position, and verifies the presence or absence of the error by comparison between the calculated edge distance and the verification reference value.

In order to perform the edge position verification at higher speed, the energy intensity distribution 214 generated by the intensity-distribution trimmed part removal process (in step S20) may be used.

[iii: Distance Verification]

Referring to FIGS. 22 and 23, distance verification is performed (in steps S51 and S52) based on an edge polygon 216 generated by the contour polygonal approximation (in step S26). More specifically, in the contour polygon distance calculation (in step S51), the CPU 105 calculates a distance (corresponding to a pattern width or pattern distance) between the opposed edges of the edge polygon 216 (estimated fished shape) generated by the contour polygonal approximation (in step S6). And, the CPU 105 compares the calculated edge-edge distance with a predetermined verification reference value. Based on the magnitude relationship therebetween, it is determined whether or not there is an error of a distance of the side of the polygon, namely, a polygon side distance error. When there is the polygon side distance error, the CPU 105 outputs a verification error including the position (coordinates) of the polygon side distance error (in step S9).

In order to perform the distance verification at higher speed, the energy intensity distribution 214 generated by the intensity-distribution trimmed part removal process (in step S20) may as well be used.

After the lithography verification described above, the CPU 105 outputs the result of verification (in step S9). That is, when there is any verification error, the CPU 105 outputs the type and position of the error. At this time, the result of verification may be preferably output in the form of display that can be viewed by the user, or in the form that is available in the following step.

In this way, the lithography verification calculates the distance between the opposed edges of the edge polygon, and also verifies the presence or absence of the error by comparison between the calculated edge-edge distance and the verification reference value.

In the above description, four types of verification processes are shown by way of example, but all verification processes are not necessarily performed. Based on the process of interest, the verification process to be performed is appropriately selected. The lithography verification is not limited to the above four types of verification processes, but may employ other verification processes.

As shown in FIG. 22, the procedure for the lithography verification corresponding to the plurality of fabrication processes according to the second embodiment does not need the polygon Boolean Operation (in step S17) shown in FIG. 11. Instead of this, the intensity-distribution trimmed part removal process (in step S20) is performed. And, after the execution of the intensity-distribution trimmed part removal process (in step S20), the respective lithography verification steps are performed.

<f2: Advantages>

As shown in FIG. 22, a lithography verification error (dummy error) generated at a part (part removed by trimming) not finally affecting the final can be removed by execution of the intensity-distribution trimmed part removal process (in step S20). That is, in use of the above related art, after the execution of the verification process, the dummy error must be removed in terms of graphics. However, in this embodiment, such a process becomes unnecessary, which can make the verification process and the confirmation of the verification more effective.

The lithography simulation according to the second embodiment can provide the advantages specific to the lithography verification. As shown in FIG. 23, the lithography verification uses the simulation results in the different forms, including the energy intensity distribution 214, the intensity slope distribution of the energy intensity distribution 214, the Contour 215 indicative of the edge shape, and the edge polygon (Pf) 216.

In contrast, in application of the above related art, the simulation result indicative of the final finish is only the edge polygon 216. Thus, information on the energy intensity distribution and the intensity slope distribution about the energy intensity distribution is lost. In the related art, in order to perform the lithography verification on such things, the lithography verification is performed on the energy intensity distribution 211 generated by the first mask 201 and the energy intensity distribution 212 generated by the second mask 202, and then an error caused by the part (part to be removed by trimming) not affecting the final finish among the verification errors output is regarded as the dummy error and then needs to be removed.

As mentioned above, in application of the above related art, an additional process needs to be performed taking into consideration the contents of the plurality of fabrication processes. In contrast, the second embodiment does not need any additional process. Further, the second embodiment can easily obtain the energy intensity distribution 214 and its intensity slope distribution of the positions required for the lithography verification, and thus can perform the lithography verification with higher accuracy.

Moreover, the second embodiment can have the same advantages as those of the above first embodiment.

G. Third Embodiment

Next, lithography simulation according to a third embodiment will be described below. The third embodiment will describe the case where an optical proximity correction (OPC) process (OPC process) is performed using the lithography simulation of the above first embodiment.

<g1: Procedure>

Figure 24:
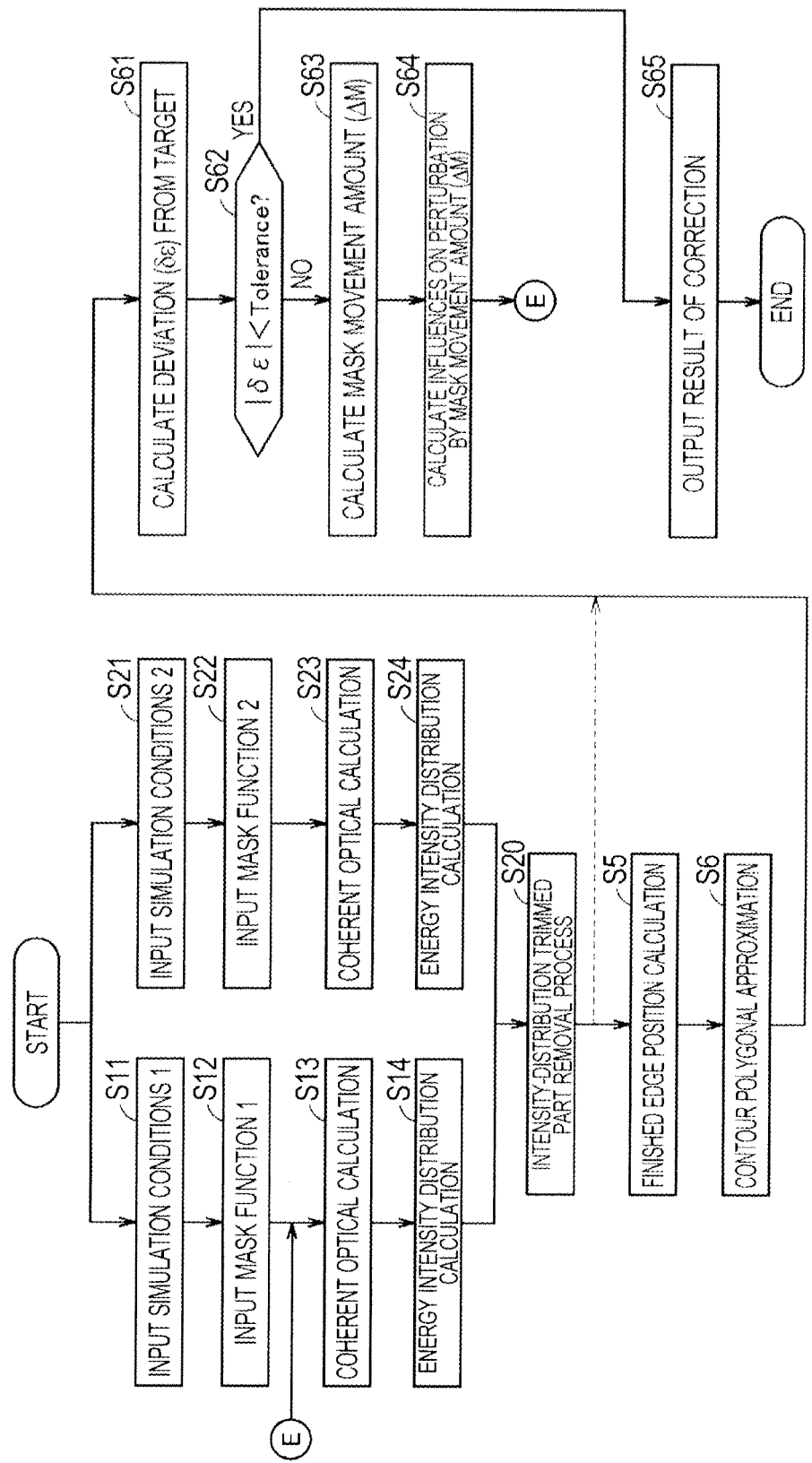
FIG. 24 is a flowchart showing a procedure for lithography simulation according to a third embodiment.
Figure 25:
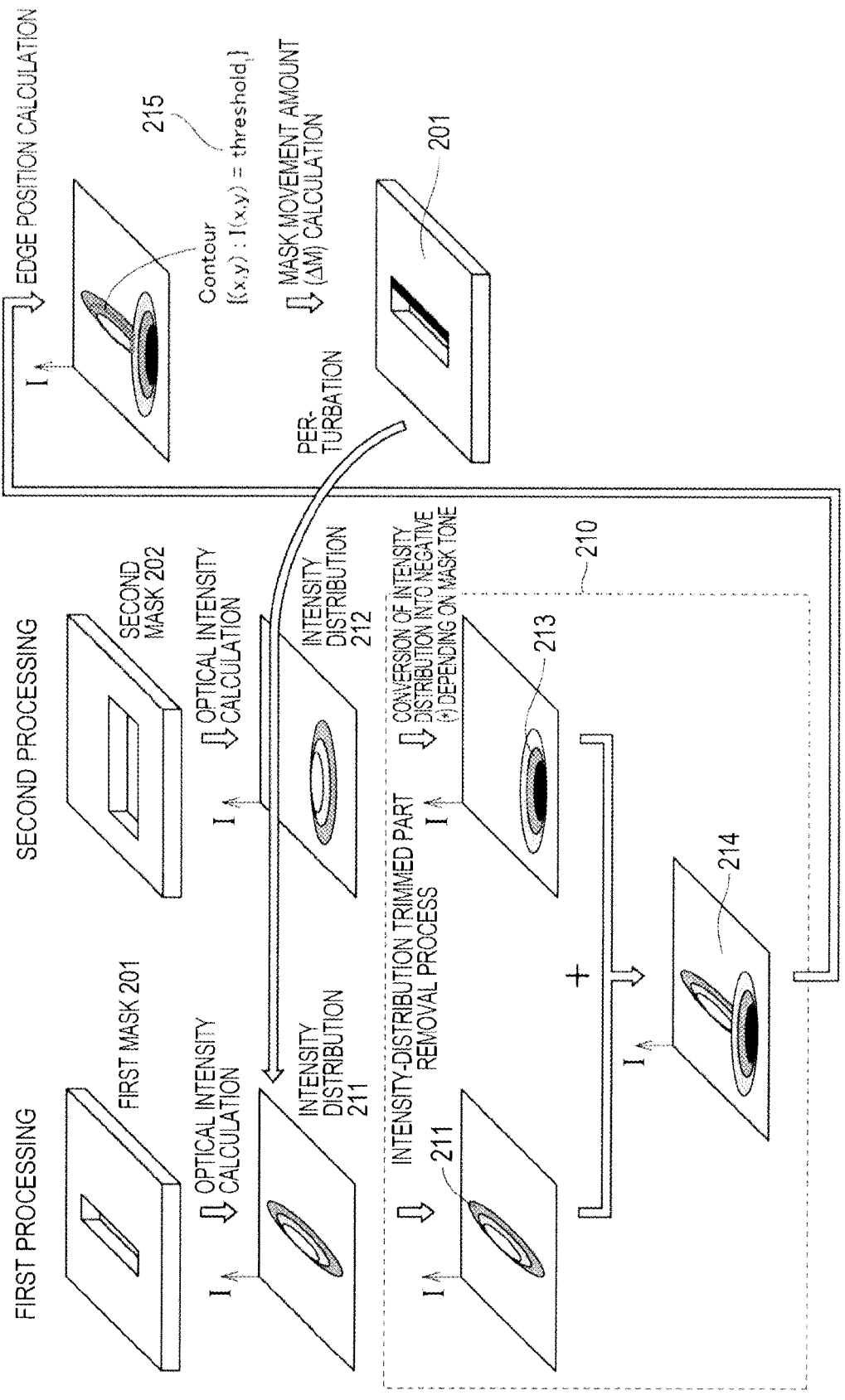
FIG. 25 is a diagram for explaining the contents of processing corresponding to FIG. 24.

FIG. 24 is a flowchart showing the procedure for the lithography simulation according to the third embodiment. More specifically, FIG. 24 shows the procedure for the OPC process corresponding to the plurality of fabrication processes. The CPU 105 of the computer 100 executes the simulation program to achieve each step shown in FIG. 24. FIG. 25 is a diagram for explaining the contents of processing corresponding to FIG. 24.

The flowchart shown in FIG. 24 differs from the procedure (see FIG. 15) according to the above first embodiment in that instead of step S7, steps S61 to S65 are included. Such addition and change is provided by the optical proximity correction module 158 (see FIG. 3).

In order to correct a mask pattern and evaluate the final finish by the simulation, the OPC process needs to repeatedly calculate the influences on perturbation by a mask movement amount $\Delta M$. The influences on perturbation by the mask movement amount $\Delta M$ can be calculated based on the edge polygon 216 (estimated finished shape) generated by the contour polygonal approximation (in step S6).

Alternatively, the influences on perturbation by the mask movement amount $\Delta M$ may be calculated based on the edge shape (Contour 215) generated by the finished edge position calculation (in step S5). In this case, the processes in steps S61 to S65 are repeatedly performed based on the edge shape (Contour 215), so that the contour polygonal approximation process (in step S6) can be omitted. Thus, this embodiment can perform the processing at higher speed, like the lithography verification of the above second embodiment.

As mentioned above, the influenced on the perturbation by the mask movement amount $\Delta M$ is calculated using an algorithm according to information used.

Referring to FIGS. 24 and 25, in step S61, an amount of deviation of an estimated edge position provided by the simulation from the designed target provided by the OPC process is calculated using the edge polygon 216 or Contour 215. That is, the CPU 105 calculates the deviation amount ($\delta \epsilon$) from the designed target.

Subsequently, the CPU 105 determines whether or not the deviation amount ($\delta \epsilon$) from the designed target calculated in step S61 is within a predetermined tolerance (in step S62). When the deviation amount ($\delta \epsilon$) is equal to or more than the predetermined tolerance (if NO in step S62), the CPU 105 calculates an OPC correction amount corresponding to the deviation amount (in step S63). That is, the CPU 105 calculates a mask movement amount $\Delta M$ corresponding to the deviation amount ($\delta \epsilon$). Subsequently, the CPU 105 estimates the final finish again based on the calculated mask movement amount $\Delta M$. That is, the CPU 105 calculates the influences on perturbation by the mask movement amount $\Delta M$ (in step S64). And, the processes after step S13 are performed again.

At this time, in the coherent optical calculation (in step S13), the CPU 105 performs a restrictive coherent optical calculation on apart changed due to the movement of the edge position. The coherent optical calculation (in step S13) in such repeated operations can simplify the processing by adding the influences on the perturbation to the result before the perturbation.

In the general OPC process, the repetition processing including steps S61 to S64 is carried out about five to ten times for each correction of the edge. In some cases, the repetition processing further needs another repetition process depending on the algorithm, so that the repetition processing is performed ten or more times. In such a case, the above restrictive coherent optical calculation can be employed to effectively reduce the amount of operation.

In step S62, in addition to the deviation amount ($\delta \epsilon$) from the designed target, the intensity or intensity slope, or the like may be evaluated, like the lithography verification. Further, the relationship with other steps (a hole formation step for a wiring process, an activation step for a poly process, and the like) may be evaluated, like the lithography verification.

In contrast, when the deviation amount (δε) is within the tolerance (Tolerance) (if YES in step S62), the CPU 105 outputs the result of correcting (in step S65).

In this way, the lithography simulation of this embodiment involves calculation of the deviation amount (δε) of the specified edge position from the designed target position, and also correction of the first mask 201 based on the calculated deviation amount (δε). In the correction process, the first mask 201 is repeatedly corrected until the calculated deviation amount is equal to or less than a predetermined threshold. Although not shown clearly, when the maximum number of repetition is reached, the repetition processing can be finished and then the operation can also proceed to step S65.

As shown in FIG. 24, the procedure for the OPC process corresponding to the plurality of fabrication processes according to the third embodiment does not need the polygon Boolean operation (in step S17) shown in FIG. 11. Thus, the polygon operation with a high load cannot be required every repetition.

<g2: Advantages>

As mentioned above, most of the processing loads on the OPC process are caused by the repetition processing including steps S61 to S64. Thus, in the third embodiment, the coherent optical calculation is approximately used for the calculation of the mask movement amount ΔM (in step S63) and for the calculation of the influences on the perturbation by the mask movement amount ΔM (in step S64), whereby the result of the calculation can be reused to thereby reduce the processing loads. Thus, all optical calculations need not be repeatedly performed, which can achieve speeding up of the processing.

Such effective calculation processing will be described again with reference to FIG. 8. An optical system used in the manufacturing process of a semiconductor device is generally a partial coherent optical system. In a module 32 shown in FIG. 8, the coherent optical calculation is the premise. The contribution of the perturbation due to the mask movement amount ΔM to the first mask 201 can be calculated by adding only the contribution of the mask movement amount ΔM, to the result of the original shape of the mask. For this reason, the calculation load is small, which is appropriate for the OPC process. A module 34 converts the result of the calculation performed by the module 32 using a complex number, into an energy value (real value). In the partial coherent optical system used for the manufacturing process for a semiconductor device, it is not practical to determine the contribution of the perturbation to the output result of the module 34 only by a simple addition calculation because of a large error of the calculation result.

The performance of the OPC process for the plurality of fabrication processes using the above related art needs to calculate the final edge polygon by the polygon Boolean operation. That the contour polygonal approximation needs to be repeatedly operated, which drastically increases the processing load and thus is not practical.

In contrast, the third embodiment can achieve the repetition processing at high speed, and thus can perform the OPC process in a short time.

Additionally, the third embodiment can obtain the same advantages as those of the above first and second embodiments.

H. Fourth Embodiment

In the above first to third embodiments, the process for inputting the mask function indicative of the shape of the used mask has been described by way of example. In some cases, the plurality of fabrication processes possibly include processing steps independently designed. In such a case, while the OPC specifications of one mask to be used in one processing step are not decided, the simulation has to be executed. A fourth embodiment will describe a processing method which can perform the simulation even under this situation to develop the processing steps in parallel to thereby enable improvement of the development efficiency.

h1: Procedure

Figure 26:
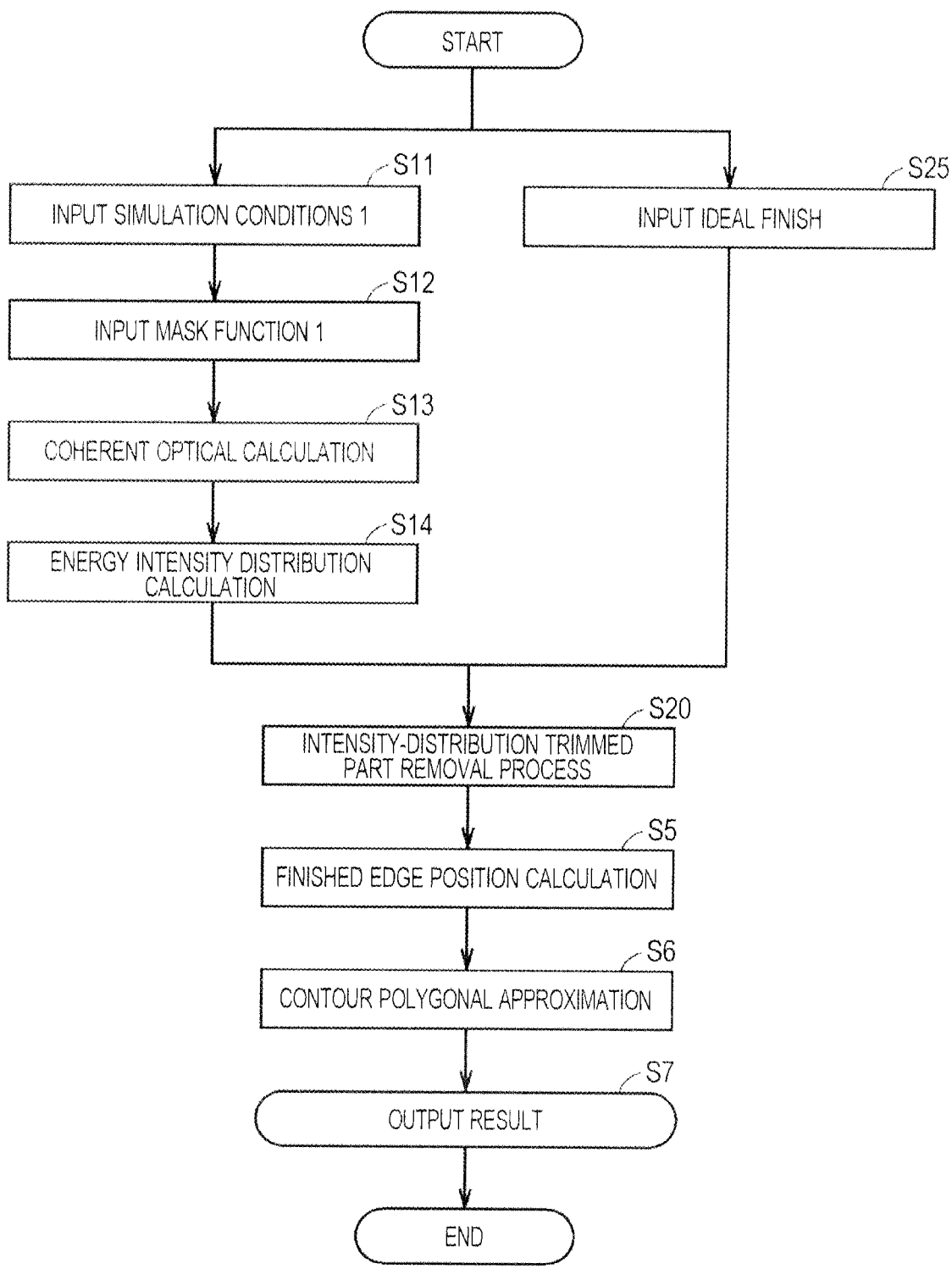
FIG. 26 is a flowchart showing a procedure for lithography simulation according to a fourth embodiment.
Figure 27B:
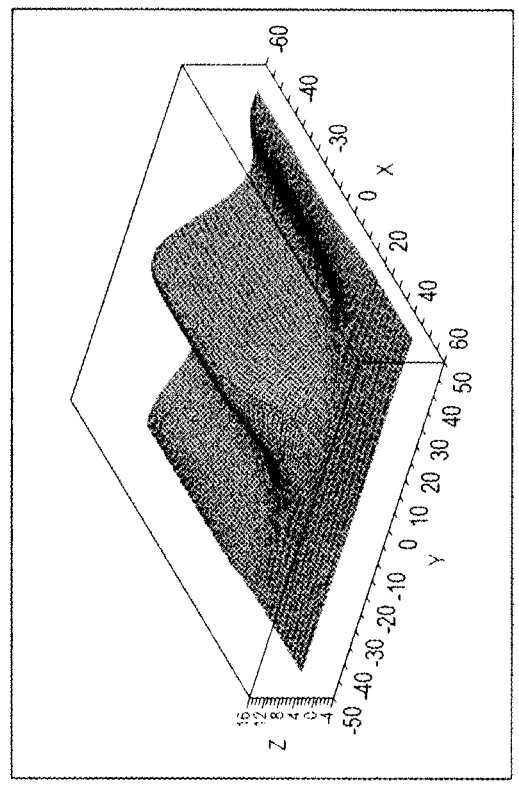
FIGS. 27A and 27B are diagrams showing an example of a first mask used in the lithography simulation according to the fourth embodiment.
Figure 27A:
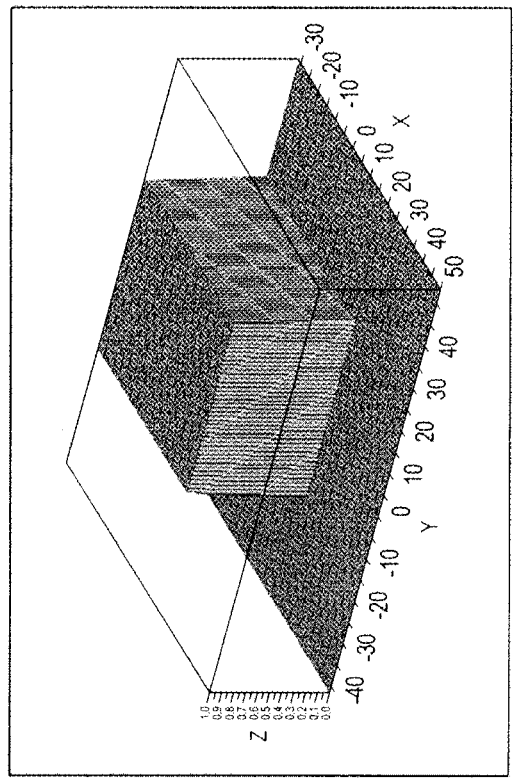

FIG. 26 is a flowchart of the procedure for the simulation lithography according to the fourth embodiment. FIG. 26 shows the procedure for simulation with the shape of a mask to be used for the second processing not determined, or without using the shape of the mask, by way of example. The CPU 105 of the computer 100 executes the simulation program to achieve the respective steps shown in FIG. 26. FIGS. 27A and 27B are diagrams for explaining the contents of processing corresponding to FIG. 26.

The flowchart shown in FIG. 26 differs from the above processing procedure according to the first embodiment (flowchart shown in FIG. 15) by comparison that the process in step S25 is executed instead of the processes in steps S21 to S24. That is, in step S25, an input of an ideal finish to be finished over the wafer by the second mask 202 for use in the second processing is received. That is, the energy intensity distribution 212 corresponding to the second mask 202 is not calculated in the coherent optical calculation (in step S23), and the ideal shape to be finished by the second mask 202 is defined using a mask function. In other words, the intensity-distribution trimmed part removal process (in step S20) involves receiving the input of the energy intensity distribution in which the designed target shape is represented by a region provided by connecting points indicating the intensity equal to the threshold.

In the intensity-distribution trimmed part removal process (in step S20), the desired shape (energy intensity distribution) to be finished by the second mask 202 has its sign reversed, and then is added to the energy intensity distribution 211 for the first mask 201. Before the addition, the adjustment of the intensive using a threshold ratio may be performed.

In this way, the intensity distribution of the ideal finish to be generated over the wafer is obtained as the energy intensity distribution 212 by the second mask 202.

Further, the relative positional relationship of the second mask 202 respective to the first mask 201 can be changed to thereby simulate the influences of mask misalignment.

h2: Examples of Application

Next, examples of application in which the above lithography simulation is actually used will be described.

Figure 28:
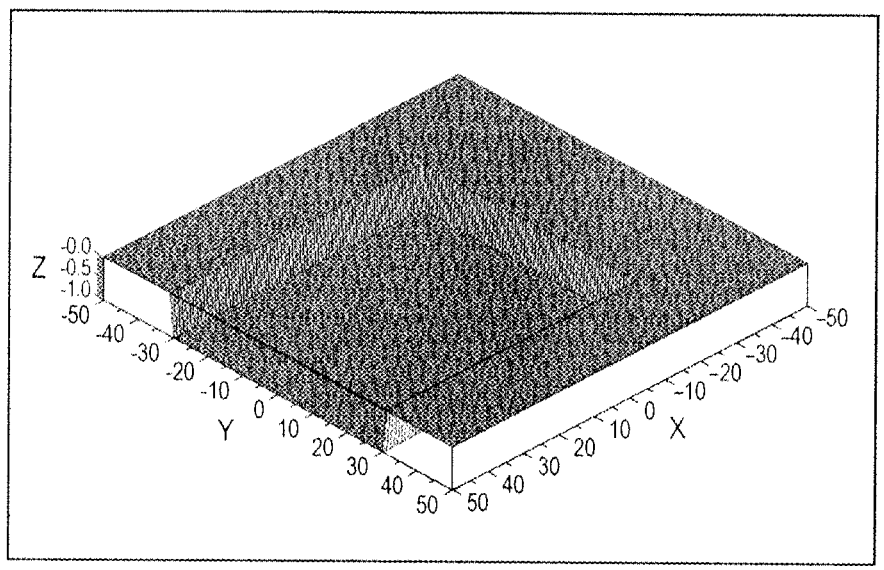
FIG. 28 is a diagram showing an example of an ideal finish of a second mask 202 used in the lithography simulation according to the fourth embodiment.
Figure 29:
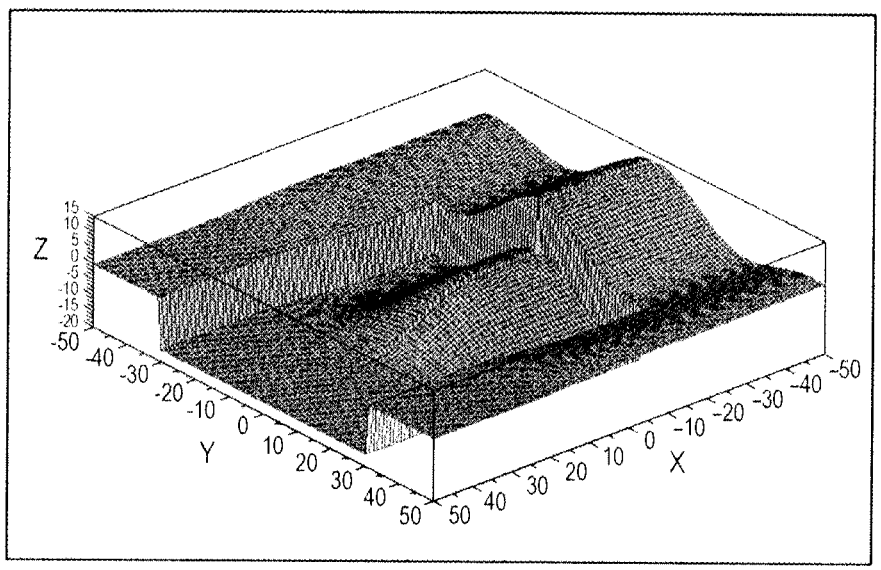
FIG. 29 is a diagram showing the result of a trimmed part removal process of the intensity distribution using the energy intensity distribution shown in FIG. 27B and the ideal finish shown in FIG. 28.
Figure 30:
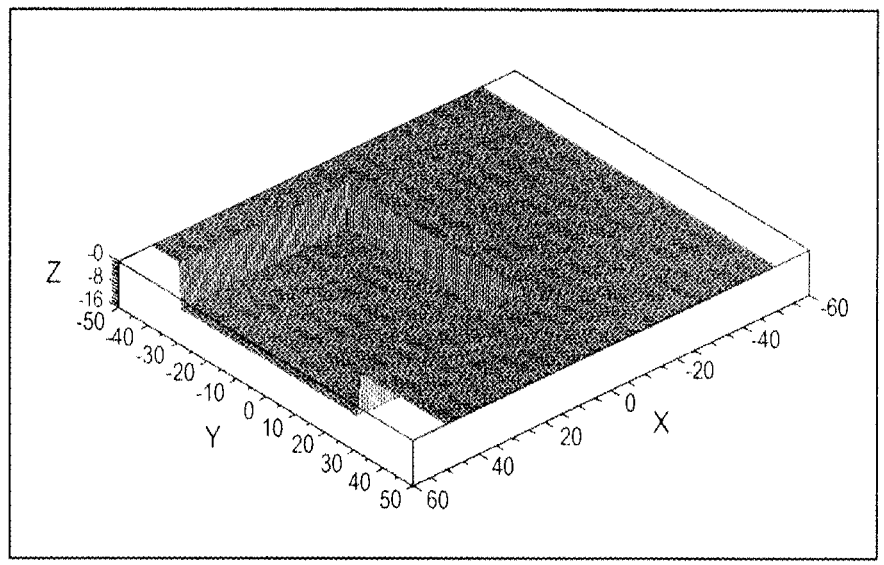
FIG. 30 is a diagram showing an example of a mask misalignment of the second mask 202 shown in FIG. 28.
Figure 31:
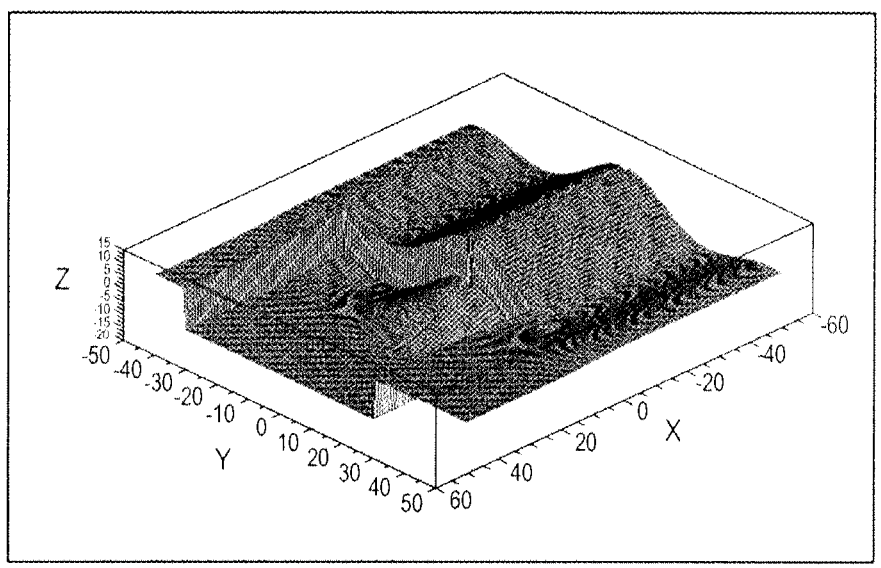
FIG. 31 is a diagram showing the result of a trimmed part removal process of the intensity distribution, taking into consideration the mask misalignment shown in FIG. 30.

FIGS. 27A and 27B are diagrams showing one example of the first mask 201 used in the lithography simulation according to the fourth embodiment. FIG. 28 is a diagram showing one example of a desired finish of the second mask 202 used in the lithography simulation according to the fourth embodiment. FIG. 29 is a diagram showing the result of the intensity-distribution trimmed part removal process using the energy intensity distribution shown in FIG. 27B and the ideal finish shown in FIG. 28. FIG. 30 is a diagram showing one example of a misalignment of the second mask 202 shown in FIG. 28. FIG. 31 is a diagram showing the result of the intensity-distribution trimmed part removal process taking into consideration the misalignment shown in FIG. 30. Each of FIGS. 27 to 31 is represented by a matrix defined with a relatively coarse interval. Thus, the processing is achieved within the matrix or by the operation between the matrixes.

FIG. 27A shows a first mask function corresponding to the first mask 201. FIG. 27B shows the energy intensity distribution obtained by performing the lithography simulation in response to the first mask function.

FIG. 28 shows a function corresponding to the ideal finish provided by the second mask 202. The function has a non-background part (trimmed part) as a negative value.

In the above first to third embodiments, the lithography simulation is performed using the second mask function defining the second mask 202, so that the corresponding energy intensity distribution is calculated. In the fourth embodiment, if assumption is made that the shape of the designed target to be finished using the second mask 202 becomes the final finish as it is, the function indicative of the shape is employed as one condition. In a developing stage where the OPC specifications for the second mask 202 are not decided yet, the above assumption is effective when considering the OPC specifications for the first mask 201, or when simultaneously considering also the respective OPC specifications for the first and second masks.

FIG. 29 shows the result of the intensity-distribution trimmed part removal process calculated under the above conditions. In the function corresponding to the ideal finish shown in FIG. 28, the light intensity of the non-background part (trimmed part) is adjusted to be less than the threshold. Thus, the shape of the final finish over the wafer obtained by the execution of the plurality of fabrication processes corresponds to the shape (Contour) provided by connecting parts indicating the energy intensity equal to that of the threshold in the energy intensity distribution shown in FIG. 29. For example, when the threshold is a fixed value, a contour line equal to the level of the threshold in the energy intensity distribution shown in FIG. 29 corresponds to the Contour.

FIG. 30 shows the energy intensity distribution obtained by parallel translation of the ideal finish of the second mask 202 in FIG. 28 in the forward left direction. FIG. 31 shows the result of the intensity-distribution trimmed part removal process using the energy intensity distribution after the parallel translation shown in FIG. 30. Such a parallel translation process can be easily achieved by shifting elements of the matrix.

The relationship between the energy intensity distribution shown in FIG. 29 and the energy intensity distribution shown in FIG. 31 shows the shape of the final finish over the wafer, taking into consideration misalignment generated by the second mask 202. In this way, the influences on the deviation between the first mask 201 and second mask 202 superimposed on each other can be easily evaluated by changing the relative relationship between the energy intensity distribution corresponding to the second mask 202 and the energy intensity distribution corresponding to the first mask 201.

h3: Advantages

According to the fourth embodiment, in the plurality of fabrication processes, even when the OPC specifications for one mask are not determined yet, the simulation can be carried out, which can improve the efficiency of development.

According to the fourth embodiment, the plurality of fabrication processes can be simulated by a simple matrix operation, such as sign reversing, addition, or subtraction. This arrangement can suppress the increase in processing load on the simulation, and also can reduce the costs of development and configuration of applications. Further, the processing in steps S21 to S24 can be omitted to reduce the processing load.

According to the fourth embodiment, the deviation between the masks superimposed on each other (mask misalignment) can be easily calculated by a matrix shift. This embodiment can suppress the increase in processing load associated with the simulation, while reducing the costs of development and configuration of applications.

I. Fifth Embodiment

Although in the above first to fourth embodiments, the process for application of the trim process has been described by way of example of the plurality of fabrication processes, a double patterning technology (hereinafter referred to as a "DPT") can also be applied as another example. In the fifth embodiment, the procedure for the lithography simulation on the double patterning process will be described below.

The double patterning is a manufacturing process which involves forming respective wirings or the like using masks. Unlike the above trim process, in the double patterning, the total of the shapes formed by the respective masks serve as the final finish.

<i1: Procedure>

Figure 32:
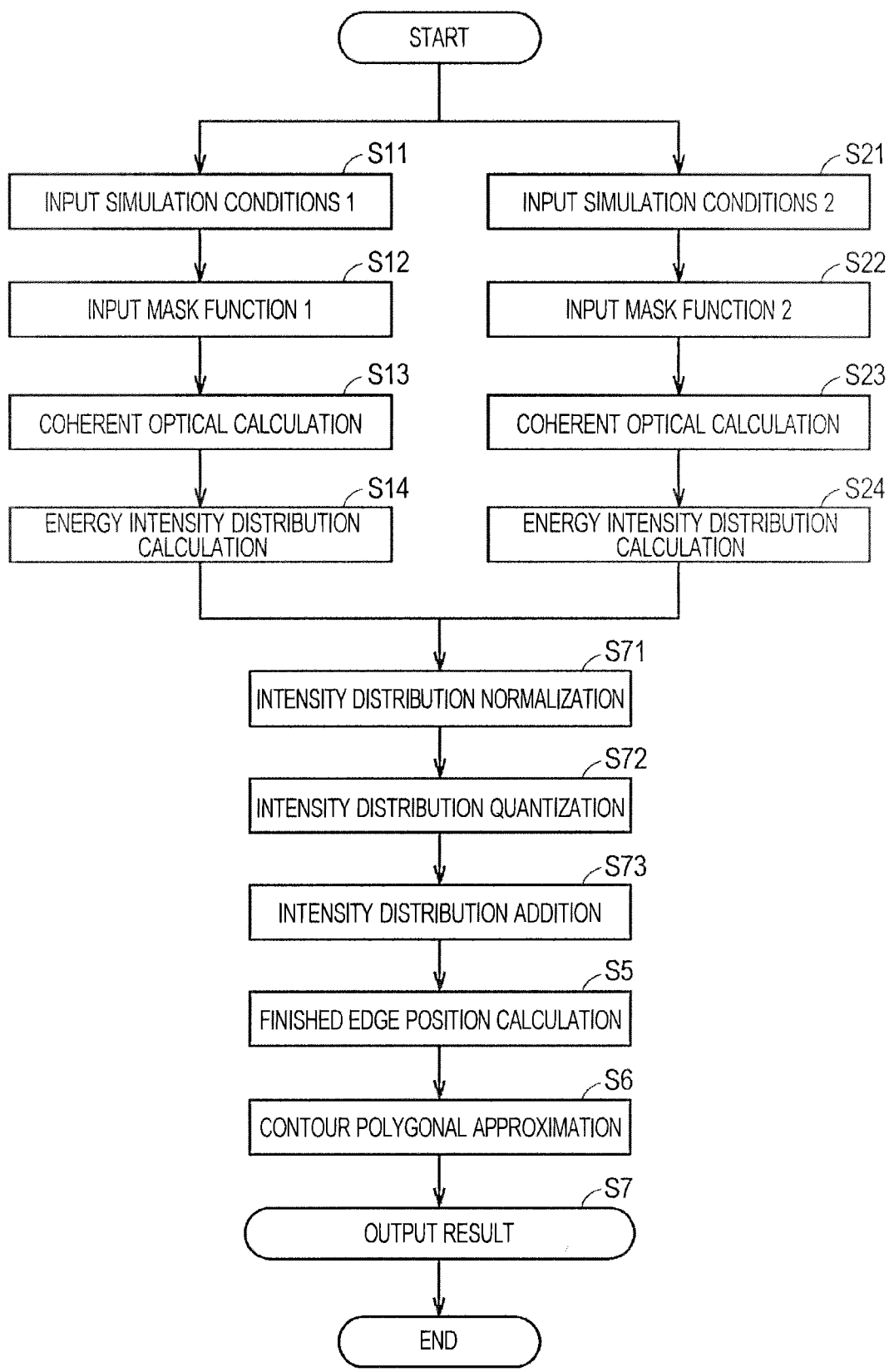
FIG. 32 is a flowchart showing a procedure for lithography simulation according to a fifth embodiment.
Figure 33:
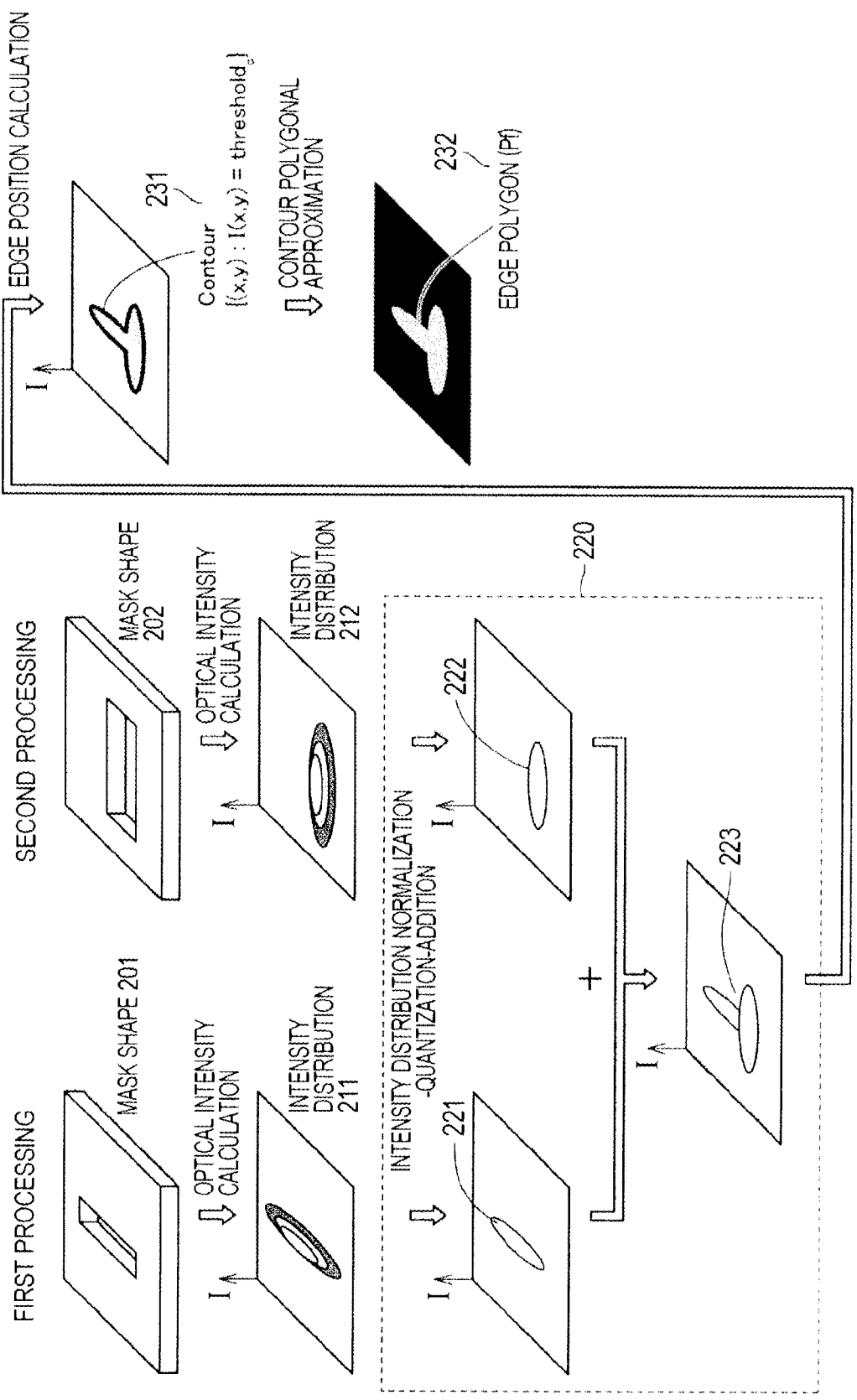
FIG. 33 is a diagram for explaining the contents of processing corresponding to FIG. 32.

FIG. 32 shows a flowchart of the procedure for lithography simulation according to the fifth embodiment. The CPU 105 of the computer 100 executes the simulation program to achieve the respective steps shown in FIG. 32. FIG. 33 is a diagram for explaining the contents of processing corresponding to FIG. 32.

The flowchart shown in FIG. 32 differs from the procedure according to the above first embodiment (flowchart shown in FIG. 15) in that intensity distribution normalization (in step S71), intensity distribution quantization (in step S72), and intensity distribution addition (in step S73) are added instead of the intensity distribution trimmed part removal process (in step S20). These added and changed processes are provided by the intensity distribution adjustment module 160 (see FIG. 3).

The intensity distribution normalization (in step S71) is a process for normalization between the virtual energy intensity distribution 211 generated by the first mask 201 and the virtual energy intensity distribution 212 generated by the second mask 202. The intensity distribution addition (in step S73) is the process which involves outputting the intensity distribution generated by a number of processes by addition of both the normalized energy intensity distribution and the quantized energy intensity distribution.

As shown in FIG. 32, in the fifth embodiment, intensity distribution normalization-quantization-addition 220 is performed instead of the intensity-distribution trimmed part removal process 210 shown in FIG. 15.

The same process as that included in the flowchart of FIG. 15 is designated by the same reference character, and its detailed description will not be repeated.

As shown in FIG. 32, the intensity distribution normalization (in step S71), the intensity distribution quantization (in step S72), and the intensity distribution addition (in step S73) which are added are executed before the contour polygonal approximation (in step S6). As described above, before the execution of the contour polygonal approximation (in step S6), the matrix operation using a matrix defined with a relatively coarse interval, using the sampling theorem can be installed. Thus, the processing can be effectively carried out, which does not lead to an increase in processing loads even when the plurality of fabrication processes is simulated. Thus, a software appropriate for the plurality of fabrication processes can be easily developed without drastically changing the existing software property.

Referring to FIGS. 32 and 33, in the intensity distribution normalization (in step S71), the CPU 105 adjusts (normalizes) the ratio between the energy intensity distributions respectively obtained in the first and second processing. Subsequently, in the intensity distribution quantization process (in step S72), the CPU 105 quantizes the magnitude relationship between the threshold and each of the energy intensity distributions after the adjustment. And, in the intensity distribution addition (in step S73), the CPU 105 adds the results quantized together. In this way, a virtual energy intensity distribution 223 is obtained by the DPT involving the first and second processing. When the edge position is calculated from the virtual energy intensity distribution 223, a Contour 231 indicative of the shape of the edge formed over the wafer is obtained. Further, the contour polygonal approximation is executes on the obtained Contour 231 to thereby provide an edge polygon (Pf) 232.

By the above procedure, the shape of a wafer pattern is obtained by the DPT.

In the procedure shown in FIG. 32, the intensity-distribution trimmed part removal process (step S20 shown in FIG. 15) is removed. Alternatively, when executing both the DPT and the trim process, the intensity-distribution trimmed part removal process may be executed in order of the process flow, for example, after the intensity distribution addition (in step S73). It is apparent that the intensity distribution normalization-quantization-addition shown in steps S71 to S73 can be executed together with the intensity-distribution trimmed part removal process, and thus its detailed description will not be given.

Instead of the energy intensity distribution taking into consideration the effects of the lithography (diffraction, interference, energy storing effect in resist, and the like) using one or more masks, ideal finishes to be finished by the respective masks may be used as the input as described in the above fourth embodiment. Further, the use of the above results can also execute the verification process or the OPC process.

<i2: Intensity Distribution Normalization-Quantization-Addition>

Next, referring to FIGS. 34 to 37, the detailed contents of processing including the intensity distribution normalization-quantization-addition (in steps S71 to S73) shown in FIG. 32 will be described below.

Figure 34A:
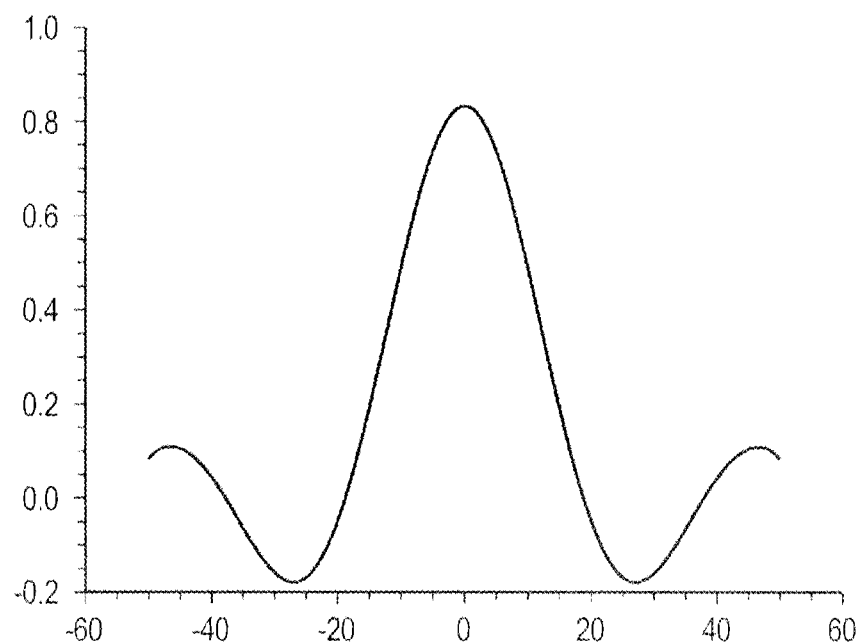
FIGS. 34A and 34B are diagrams showing one example of a virtual energy intensity distribution using a mask in the lithography simulation according to the fifth embodiment.
Figure 34B:
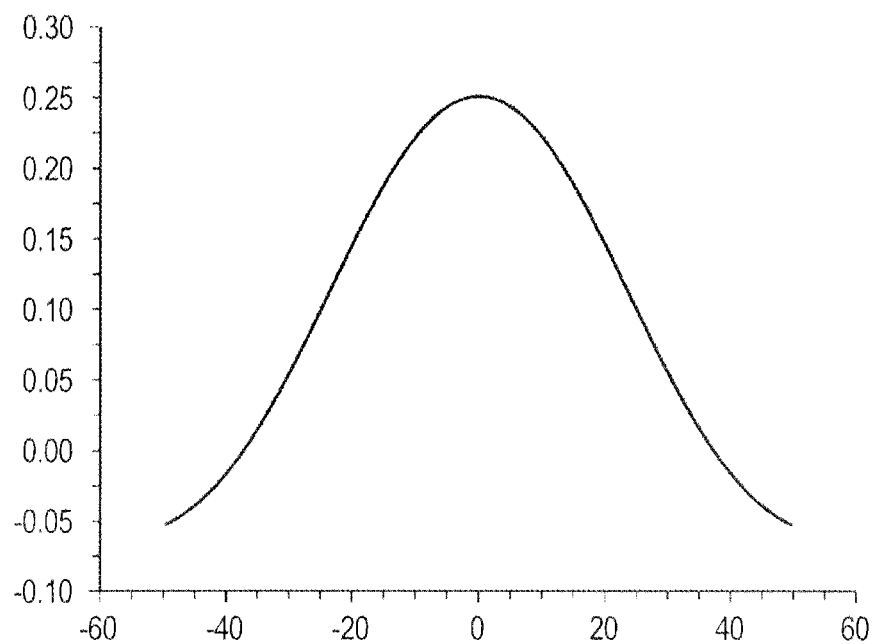
Figure 35A:
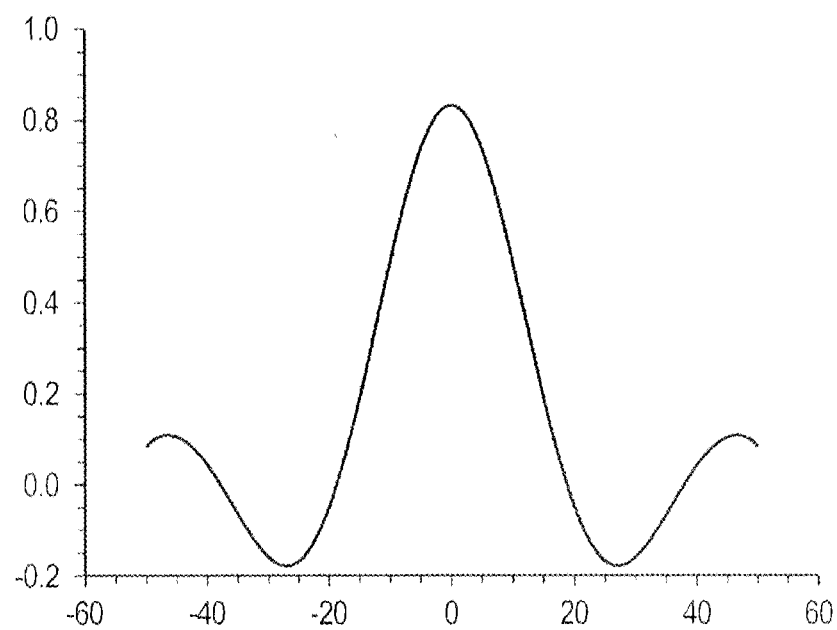
FIGS. 35A and 35B are diagrams showing one example of the result of normalizing the virtual energy intensity distribution shown in FIGS. 34A and 34B.
Figure 35B:
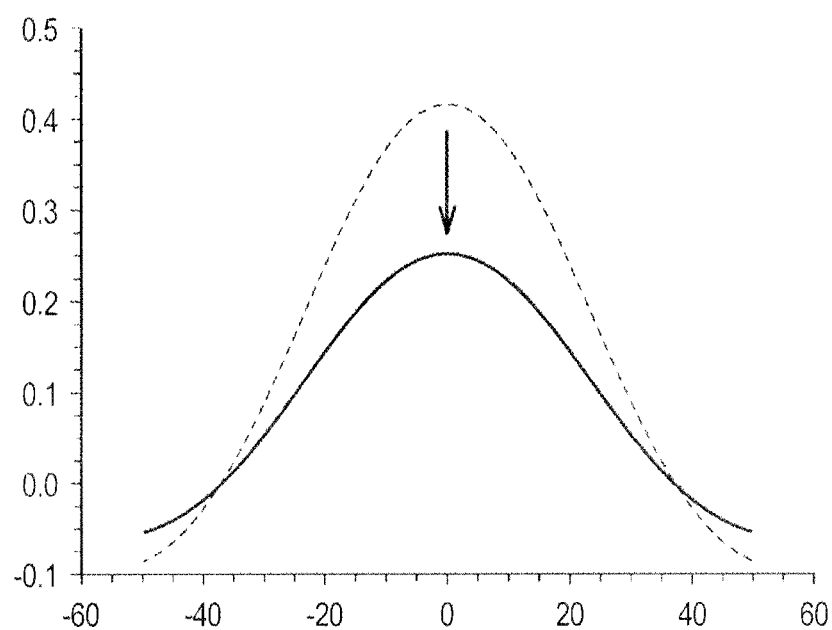

First, referring to FIGS. 34A and 34B and FIGS. 35A and 35B, the intensity distribution normalization will be described below. FIGS. 34A and 34B are diagrams showing one example of the vertical energy intensity distribution provided by the mask used in lithography simulation according to the fifth embodiment. FIG. 34A shows a virtual energy intensity distribution provided by the first mask 201 in any position over the wafer, and FIG. 34B shows a virtual intensity distribution provided by the second mask 202 in any position over the wafer. FIGS. 35A and 35B show one example of the result of the normalization of the virtual energy intensity distributions shown in FIGS. 34A and 34B.

In FIGS. 34A and 34B and FIGS. 35A and 35B, the horizontal axis indicates the position over the wafer (whose value is expressed in any units), and the longitudinal axis indicates the level of intensity (whose value is expressed in any units). The same goes for other figures, FIGS. 36 to 39. Within the computer 100, these energy intensity distributions are defined using a matrix with a relatively coarse interval. Actually, a three-dimensional representation is provided in which the intensity axis is given with respect to each of an X axis and a Y axis over the wafer. However, in the present specification, a two-dimensional representation that can be easily viewed is used for the following description.

Generally, since the first processing differs from the second processing in conditions, the energy intensity distribution, and the threshold indicative of the edge position calculated in response to the energy intensity distribution differs depending on the processing. Thus, a point of intersection between each energy intensity distribution and a threshold corresponding to the energy intensity distribution is obtained by comparison therebetween, and determined as the edge position of a pattern over the wafer.

That is, a set of solutions of "x" satisfying the following formula (1) serves as the edge position of the pattern formed over the wafer.

$$f_s(x) - f_t(x) = 0 \tag{1}$$

For simplifying the description, the position over the wafer is designated by one-dimensional value x. When the position over the wafer is represented by the two-dimensional value (x, y), both functions are represented by a function of (x, y). In the formula, $f_s(x)$ is a function of the position over the wafer of the energy intensity distribution, and $f_t(x)$ is a function of the position of the threshold.

Further, the function regarding the threshold can be deformed into the following formula (2):

$$f_t(x) = f_t'(x) + C_{threshold} \tag{2}$$

wherein $C_{threshold}$ a constant term, which does not depend on the position over the wafer. Substitution of the formula (2) into the formula (1) provides the formula (3).

$$f_s(x) - f_t'(x) = C_{threshold} \tag{3}$$

when the virtual energy intensity distribution $f_{ps}(x)$ is defined as the formula (4), the following formula (5) is obtained.

$$f_{ps}(x) = f_s(x) - f_t'(x) \tag{4}$$

$$f_{ps}(x) = C_{threshold} \tag{5}$$

As mentioned above, the use of the virtual energy intensity distribution can express the edge position over the wafer using the intersection point of the energy intensity distribution and the constant $C_{threshold}$.

FIGS. 34A and 34B respectively show an imaginary intensity distribution (virtual intensity distribution) $f_{ps}1(x)$ provided by the first mask 201, and an imaginary intensity distribution (virtual intensity distribution) $f_{ps}2(x)$ provided by the second mask 202. The thresholds corresponding to the first processing and the second processing are defined as the threshold$_1$ and the threshold$_2$, respectively.

In FIG. 34A, an intersection point between the virtual intensity distribution $f_{ps}1(x)$ and the threshold$_1$ is the edge point over the wafer. Also, in FIG. 34B, an intersection point between the virtual intensity distribution $f_{ps}2(x)$ and the threshold$_2$ is the edge point over the wafer.

The respective virtual intensity distributions are adjusted according to the ratio of the thresholds therebetween, so that both intersection points (edge positions) can be calculated using the same threshold. In the present specification, such an adjustment process is referred to as "normalization".

That is, referring to FIG. 35A, the virtual intensity distribution $f_{ps}1(x)$ shown in FIG. 34A is shown as it is. In contrast, referring to FIG. 35B, another virtual intensity distribution $f_{ps}2'(x)$ after the normalization is shown. The virtual intensity distribution $f_{ps}2'(x)$ is calculated according to the following formula (6).

$$f_{ps2}'(x)=f_{ps2}(x)\cdot\text{threshold}_1/\text{threshold}_2 \quad (6)$$

By this normalization, the common threshold (threshold$_1$ in this example) is compared with both the virtual intensity distributions, which determines the respective edge positions over the wafer.

Figure 36A:
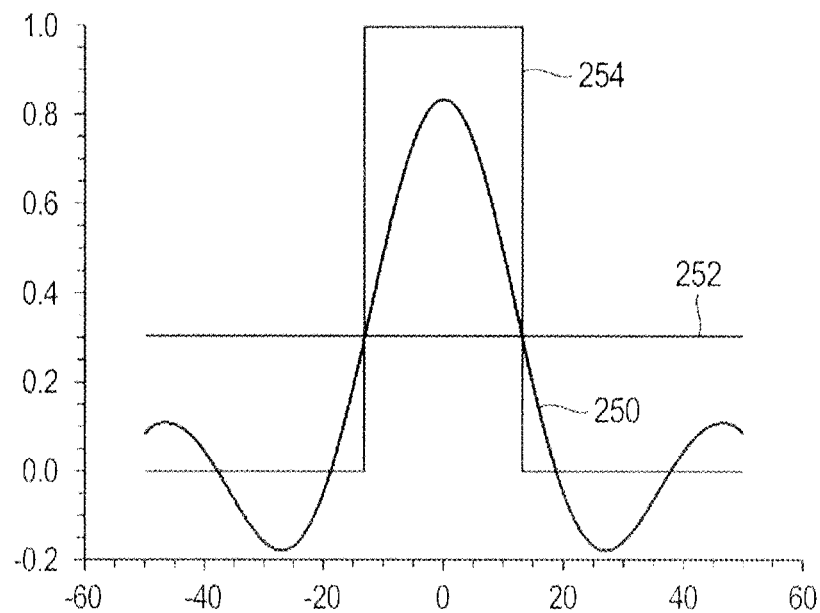
FIGS. 36A and 36B are diagrams showing an example of the result of quantizing the normalized virtual energy intensity distribution shown in FIGS. 35A and 35B.
Figure 36B:
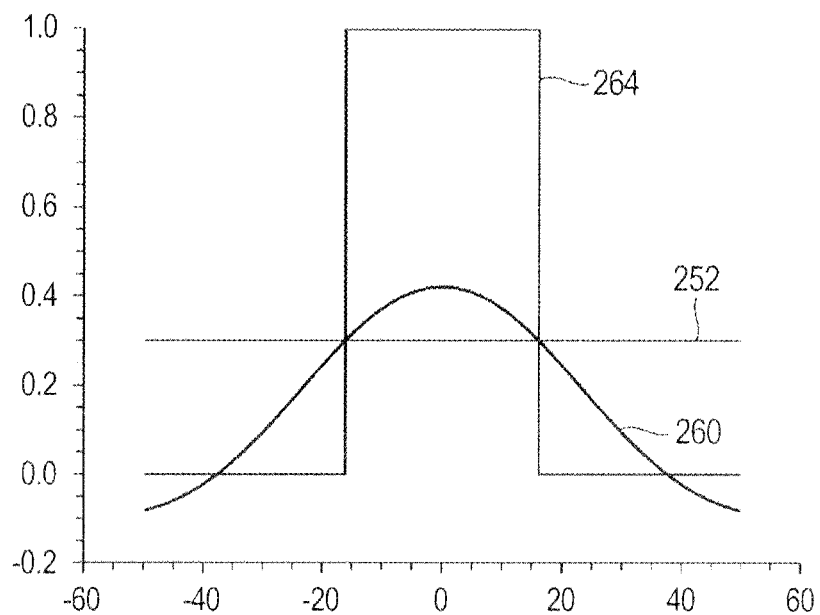

Next, referring to FIGS. 36A and 36B, the quantization will be described. FIGS. 36A and 36B show diagrams of one example of the result of quantization of the virtual energy intensity distribution normalized as shown in FIGS. 35A and 35B. FIG. 36A shows a virtual intensity distribution after the quantization using the first mask 201, and FIG. 36B is a virtual intensity distribution after the quantization using the second mask 202.

FIGS. 36A and 36B illustrate three functions. The three functions include the virtual intensity distributions 250 and 260 obtained after the quantization shown in FIGS. 35A and 35B, the threshold (common threshold$_1$ in this example) 252, and the virtual intensity distributions 254 and 264 obtained after the quantization.

In the quantization, among points located inside and outside the collection of points indicative of edges (generally, a closed surface) in the simulation, the points located on the side representing the wafer pattern shape are designated by "1" (or a sufficiently large value with respect to the threshold), and other points located on the other side are designated by "0" (or a sufficiently small value including a negative value with respect to the threshold). The term "side representing the wafer pattern shape" generally means, for example, the inside of the closed surface, that is, the side with a higher virtual intensity distribution, in a hole formation process of a positive process. The relationship between "1" and "0" (magnitude relationship) after the quantization may be reversed.

The operation until this step can be carried out by performing a simple matrix operation on matrixes defined with relatively coarse interval indicative of the intensity distributions associated with the first and second masks. The use of the virtual intensity distributions 254 and 264 obtained after the quantization process can easily calculate the DPT (and process about trim) using masks with the matrix defined with the relatively coarse interval.

Figure 37A:
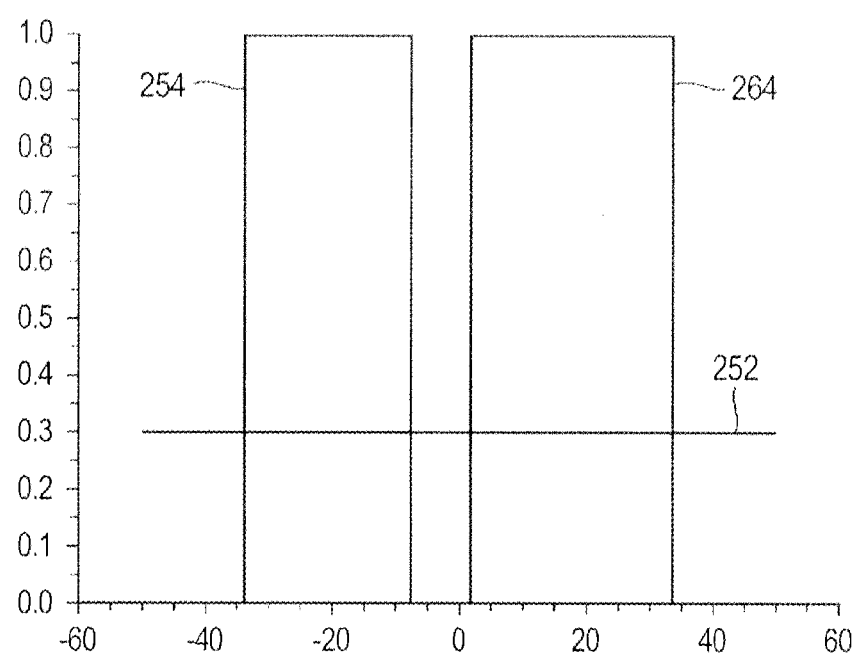
FIGS. 37A and 37B are diagrams showing an example of the result of adding the quantized virtual energy intensity distribution shown in FIGS. 36A and 36B.
Figure 37B:
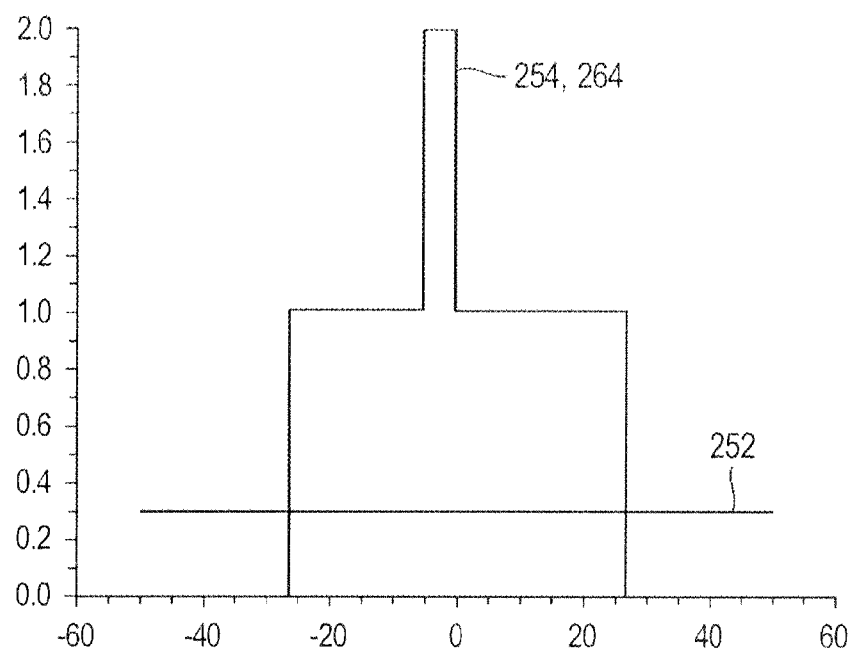

Then, referring to FIGS. 36A and 36B, the addition will be described below. FIGS. 37A and 37B show an example of the result of addition of the quantized virtual energy intensity distributions shown in FIGS. 36A and 36B. FIG. 37A shows the quantized virtual intensity distributions 254 and 264 and the threshold 252 when the first mask 201 and the second mask 202 are shifted horizontally from each other. FIG. 37B shows the quantized virtual intensity distributions 254 and 264 and the threshold 252 when the patterns formed by the first mask 201 and the second mask 202 are superimposed over each other.

The example shown in FIG. 37A corresponds to the case where wafer patterns respectively formed by the first mask 201 and the second mask 202 are shifted from each other. More specifically, the quantified virtual intensity distributions respectively obtained from the first mask 201 and the second mask 202 are translated in parallel to have a predetermined relative relationship therebetween, and are then added together, which gives the example shown in FIG. 37A.

When the patterns respectively formed by the first mask 201 and the second mask 202 are spaced apart from each other, the threshold 252 intersects the virtual intensity distributions at four points. In the example shown in FIG. 37A, the thus-obtained simulation result is that two patterns are separated by a distance.

When virtual intensity distributions before the quantization are added together, the result indicative of the final finish obtained by the DPT cannot normally be calculated. This is because as shown in FIG. 5A, in the plurality of fabrication processes, the gradual parts of the energy distributions in the resists caused by the diffraction effect are inherently affected to each other, but the energy distributions in the resist due to both masks are wrongly added together.

By the above quantization, such an effect on the energy distributions in the resist can be excluded to thereby appropriately take into consideration only the position of the edge obtained after the processing.

The example shown in FIG. 37B corresponds to the case where the wafer patterns respectively formed by the first mask 201 and the second mask 202 are superimposed over each other. Also in this case, like the above case shown in FIG. 31A, the quantized virtual intensity distributions respectively obtained from the first mask 201 and the second mask 202 are translated in parallel to have a predetermined relative relationship therebetween, and then are added together. Note that the amount of parallel translation in this case is different from that shown in FIG. 31A.

In the example shown in FIG. 37B, when the pattern formed by the first mask 201 is not spaced from the pattern formed by the second mask 202, the threshold 252 intersects the virtual intensity distributions at two points. Thus, in the example shown in FIGS. 37A and 37B, the thus-obtained simulation result is that the two patterns respectively formed by the masks are not spaced from each other and formed integrally with each other.

As mentioned in the above description of FIG. 37A, the quantization can be performed to exclude the influence or effect on the energy distributions in the resist formed by both masks.

FIGS. 37A and 37B show the example of simple addition. Alternatively, a normalization process may be additionally performed which involves setting a region having a value of less than "0" after the addition to "0" and setting a region having a value exceeding "1" after the addition to "1", and the like. The performance of the quantization can also omit the normalization.

<i3: Trim Process>

A trim process may be further performed on the result of the simulation calculated by the above processing.

Figure 38:
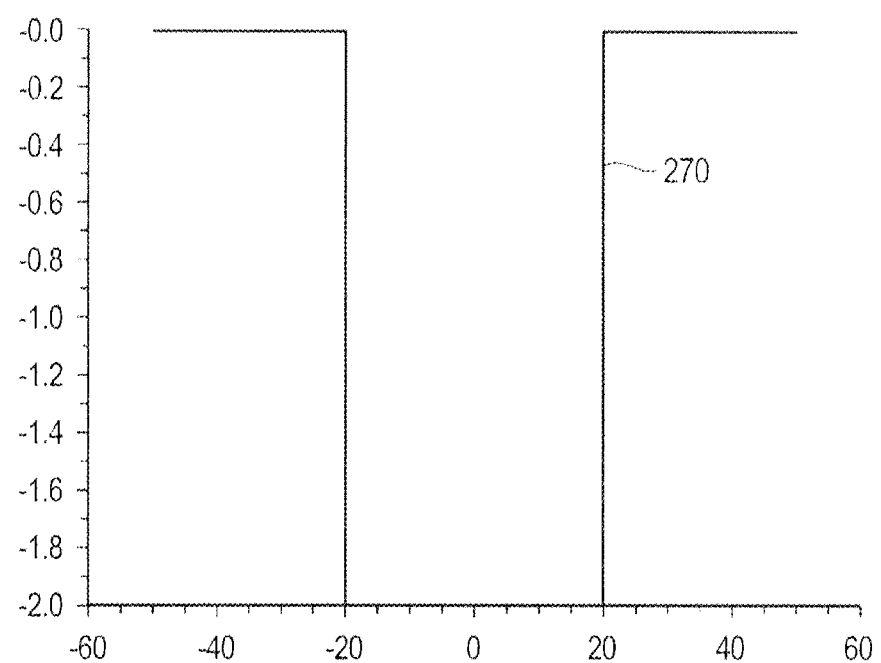
FIG. 38 is a diagram showing one example of a trim mask function used in the lithography simulation according to the fifth embodiment.
Figure 39A:
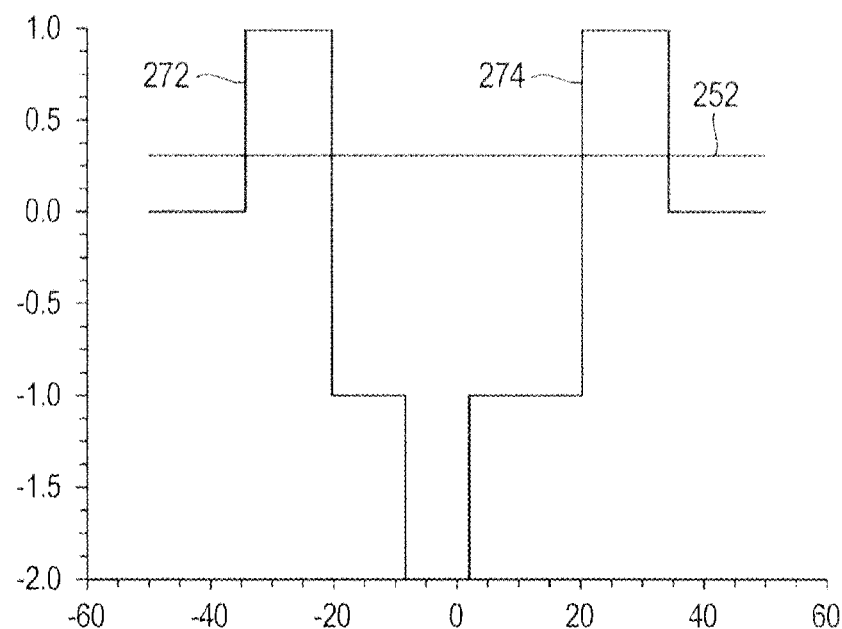
FIGS. 39A and 39B are diagrams showing the result of applying a trim process to the result of the simulation shown in FIGS. 37A and 37B, using the trim mask function shown in FIG. 38.
Figure 39B:
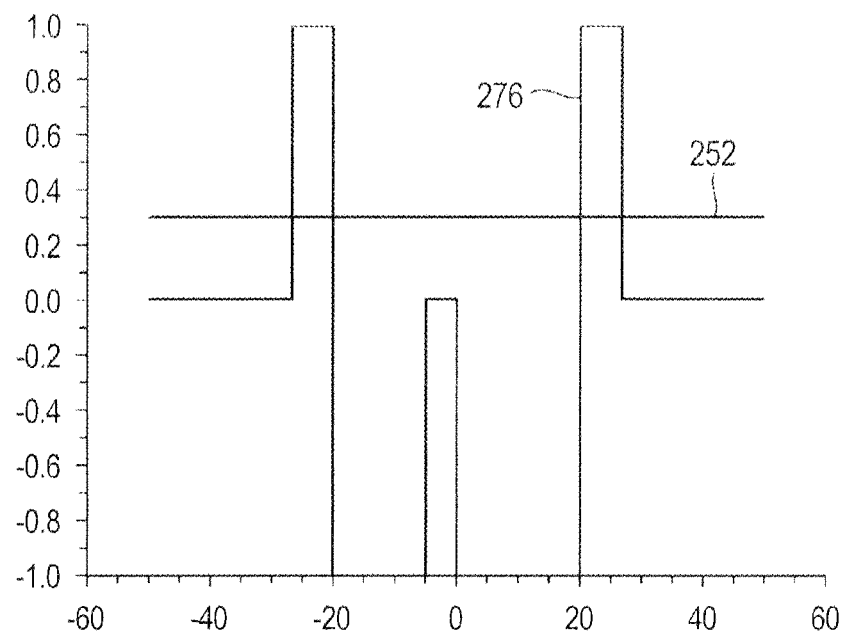

FIG. 38 is a diagram showing an example of a trim mask function used in the lithography simulation according to the fifth embodiment. FIGS. 39A and 39B are diagrams showing the result of the trim process performed on the simulation result shown in FIGS. 37A and 37B, using the trim mask function shown in FIG. 38.

In the trim mask function shown in FIG. 38, a region to be removed by the trim process (that is, a region regarded as the same as the background) is set to a sufficiently large negative value, and other regions are set to zero (0).

FIG. 39A shows a virtual intensity distribution calculated by adding the virtual intensity distribution shown in FIG. 37A to the trim mask function shown in FIG. 38. FIG. 39B shows a virtual intensity distribution calculated by adding the virtual intensity distribution shown in FIG. 37B to the trim mask function shown in FIG. 38.

As can be seen from FIG. 39A, the edge positions (indicated by reference numerals 272 and 274) of the wafer pattern, which are represented by four intersection points or points between the virtual intensity distributions 254 and 264 and the threshold 252, can be calculated by applying the trim process to the wafer pattern formed by the DPT using the first and second masks. Similarly, as can be seen from FIG. 39B, the edge positions (indicated by reference numerals 276) of the wafer pattern, which are represented by four intersection points or points between the virtual intensity distributions 254 and 264 and the threshold 252, can be calculated by applying the trim process to the wafer pattern formed by the DPT using the first and second masks.

<i4: Advantages>

In the fifth embodiment, the plurality of fabrication processes (DTP process) can be simulated by the simple matrix operation including the intensity distribution normalization-quantization-addition. According to the fifth embodiment, the deviation between the masks superimposed on each other (misalignment) can be easily calculated with a matrix shift. This can suppress the increase in load on the processing associated with the simulation, and also can decrease the developing cost and manufacturing cost of the applications.

As can be described in the above fourth embodiment, the ideal finish to be finished by each mask can be used as the input.

J. Sixth Embodiment

As described in the above first to fifth embodiments, the shape of the pattern obtained over the wafer can be simulated at high-speed after the execution of the plurality of fabrication processes. At this time, the mask functions indicating the shapes of the masks respectively used in the plurality of fabrication processes (alternatively, the ideal finishes of the masks instead of the mask functions corresponding to the mask shapes) are input.

In an application example of the simulation, a method for evaluating a mask manufacturing process using the simulation according to this embodiment will be described below.

Generally, masks are manufactured one by one. The manufacturing procedure of the mask includes the step of checking the processed mask, to correct a defect of the mask. The process for determining the necessity of correction of the defect affects the manufacturing cost of the mask. This is because the defect determined to need correction has to be checked again after being removed in the correction step and cleaned in a cleaning step. That is, there are needs for determining the presence or absence of the defect finally affecting a semiconductor device and needing the correction as the mask for the specific plurality of fabrication processes, and for reducing the cost of the correction as much as possible.

The above simulation is applied to the flow of the mask manufacturing procedure to thereby specify as an object for correction, only the defect that actually affects the shape of the pattern over the wafer after execution of the plurality of fabrication processes (including the trim process) of interest at the time of checking the mask processed.

<j1: Procedure>

Figure 40:
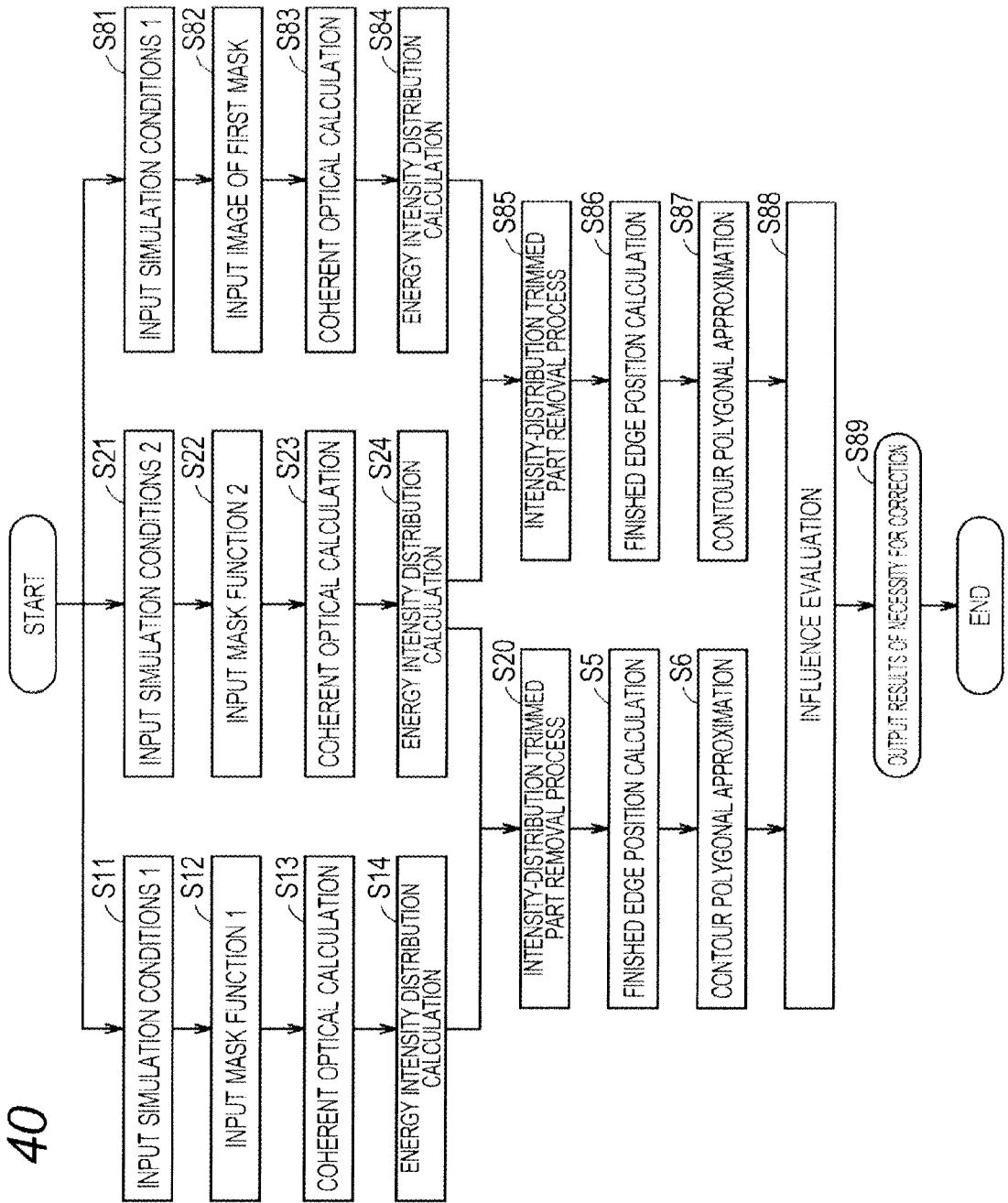
FIG. 40 is a flowchart showing a procedure for lithography simulation according to a sixth embodiment.

FIG. 40 is a flowchart showing the procedure of the lithography simulation according to the sixth embodiment. FIG. 40 shows an example in which the first mask 201 is checked in the mask manufacturing process. The CPU 105 of the computer 100 executes the simulation process to thereby achieve each step shown in FIG. 40.

The flowchart shown in FIG. 40 differs from the flowchart (see FIG. 15) of the above first embodiment in that the processes in steps S81 to S89 are added.

More specifically, in the processes of steps S81 to S84, an energy intensity distribution to be obtained by the first mask processed is calculated using characteristic values of the first mask processed. That is, the CPU 105 receives input of simulation conditions 1 for the first mask 201 (in step S81), and also receives input of an image indicative of the shape of the processed first mask 201 (in step S82). The image is typically obtained by taking an image of the processed first mask 201 using an image pickup apparatus.

Subsequently, the CPU 105 performs coherent optical calculation based on the input parameter conditions 1 and the image indicative of the first mask input (in step S83), and then performs the energy intensity distribution calculation (in step S84).

In steps S85 to S87, a polygon edge is calculated using the characteristic values of the processed first mask 201, and a mask function 2 indicative of designed values of the second mask 202. The details of the process are the same as those in steps S20, S5, and S6 described above.

Thereafter, in step S88, the CPU 105 compares the edge polygon calculated by the designed values of the first mask, that is, by the mask function 1 indicative of the ideal shape formed over the mask, and the mask function 2 indicative of the designed values of the second mask, with another edge polygon calculated by the characteristic values of the processed first mask 201 and the mask function 2 indicative of the designed values of the second mask. By comparison between the edge polygons, the CPU 105 evaluates whether or not the processed first mask 201 has any influence to make a difference from the designed values (influence evaluation process).

Then, the CPU 105 outputs the result of the necessity for correction based on the evaluation result provided in step S88 (in step S89 of outputting the result of the necessity for correction).

As mentioned above, the mask manufacturing process in this embodiment includes the step of obtaining the characteristic values of the processed first mask 201, and outputting the edge polygon indicative of the contour of a region formed over the wafer based on the relationship between the characteristic values of the processed first mask 201 and the energy intensity distribution 212 corresponding to the second mask 202. The mask manufacturing process also includes the step of determining the necessity of correction of the processed first mask 201 by evaluating two edge polygons output. Further, this embodiment is combined with the fourth embodiment using the shape of the ideal finish over the wafer, so that step S25 is used instead of steps S21 to S24, which can reduce the load on the calculation.

As to the details of other steps, see Patent Document 2 (Japanese Unexamined Patent Publication No. 1997-297109). That is, Patent Document 2 proposes a method for evaluating only the influence of a defect in the shape of a wafer pattern finally obtained by using the lithography simulation when determining the necessity of correction of the defect.

<j2: Advantages>

The simulation method of this embodiment can evaluate the shape of the pattern obtained over the wafer at high speed after the plurality of fabrication processes even when the pattern shape of one mask is not determined yet in the processes. The use of this effect can accurately determine the necessity of correction of the defect detected by the mask checking.

Thus, the defect that does not affect the mask pattern, for example, which disappears after the fabrication processes (trim process), among the defects contained in the processed masks can avoid being corrected, which can reduce the manufacturing costs of the masks.

It is to be understood that the present disclosed embodiments are illustrative and not limitative from all points. The scope of the present invention is intended to be construed on the basis of not the above description but the accompanying claims, and to include all modifications and changes within the spirit and scope equivalent to the claims.

What is claimed is:

1. A simulation device for simulating a manufacturing process including a first processing step using a first mask, and a second processing step using a second mask, said simulation device comprising:
one or more computers;
a first obtaining module, stored on the one or more computers, configured to obtain a first intensity distribution generated over a substrate of interest over a first time for processing by the first mask;
a second obtaining module, stored on the one or more computers, configured to obtain a second intensity distribution generated over the substrate over a second time different from the first time by the second mask;
a revising module, stored on the one or more computers, configured to revise an intensity of a region in the first intensity distribution to be processed by the second mask, to a value regarded as a region not to be processed, based on the second intensity distribution,
wherein the first mask is different from the second mask,
wherein the revising module is configured to reverse a sign of the second intensity distribution and then add the reversed second intensity distribution to the first intensity distribution to provide a summed intensity distribution; and
a normalization module configured to set a region of the summed intensity distribution having a value of less than "0" to "0", and to set a region of the summed intensity distribution having a value exceeding "1" to "1".

2. The simulation device according to claim 1, wherein the revising module is configured to specify an edge shape by comparing the second intensity distribution with a predetermined threshold distribution, and replace a value corresponding to a part inside the specified edge shape in the first intensity distribution by an intensity regarded as a background.

3. The simulation device according to claim 1, further comprising a verification module, stored on the one or more computers, configured to verify the presence or absence of an error by comparing at least one of an intensity level and an intensity slope in the revised first intensity distribution with a verification reference value corresponding thereto.

4. The simulation device according to claim 1, further comprising a specification module, stored on the one or more computers, configured to specify an edge position by comparing the revised first intensity distribution with a predetermined threshold distribution.

5. The simulation device according to claim 4, further comprising a verification module, stored on the one or more computers, configured to:
calculate an edge distance between the specified edge position and a designed target position, and
verify presence or absence of an error by comparing the calculated edge distance with a verification reference value.

6. The simulation device according to claim 4, further comprising an output module, stored on the one or more computers, configured to output an edge polygon indicative of a contour of a region formed over the substrate by approximating the specified edge position as a polygon.

7. The simulation device according to claim 6, further comprising a verification module, stored on the one or more computers, configured to calculate a distance between edges opposed to each other in the edge polygon and to verify presence or absence of an error by comparing the calculated distance between the edges with another verification reference value.

8. The simulation device according to claim 4, further comprising a correction module, stored on the one or more computers, configured to calculate a deviation from a designed target position for the specified edge position and to correct the first mask based on the calculated deviation,
wherein the correction module is configured to repeatedly correct the first mask until the calculated deviation becomes a predetermined threshold or less.

9. The simulation device according to claim 1, wherein the second obtaining module is configured to obtain an intensity distribution of an ideal finish to be generated over the substrate by the second mask as the second intensity distribution.

10. The simulation device according to claim 6, further comprising:
a second output module, stored on the one or more computers, configured to obtain characteristic values of the processed first mask, and to output a second edge polygon indicative of an contour of a region formed over the substrate between the obtained characteristic values of the first mask and the second intensity distribution; and
a correction necessity determination module, stored on the one or more computers, configured to determine the necessity of correction of the processed first mask by evaluating two output edge polygons.

11. The simulation device according to claim 1,
wherein the first and second intensity distributions are respectively defined as a matrix with a common grid interval, and
wherein the revising module is configured to perform calculation on the respective matrixes corresponding to the first and second intensity distributions.

12. The simulation device according to claim 1, wherein the addition module is configured to add together the first and second intensity distributions quantized by a threshold.

13. A simulation device for simulating a manufacturing process including a first processing step using a first mask, and a second processing step using a second mask, said simulation device comprising:
one or more computers;
a first obtaining module, stored on one or more computers, configured to obtain a first intensity distribution generated over a substrate of interest over a first time for processing by the first mask;
a second obtaining module, stored on the one or more computers, configured to obtain a second intensity distribution generated over the substrate over a second time different from the first time by the second mask;
an addition module, stored on the one or more computers, configured to add together the first and second intensity distributions quantized to thereby output an intensity distribution generated by the manufacturing process, wherein the first mask is different from the second mask, wherein the addition module is configured to reverse a sign of the second intensity distribution and then add the reversed second intensity distribution to the first intensity distribution to provide a summed intensity distribution; and a normalization module configured to set a region of the summed intensity distribution having a value of less than "0" to "0", and to set a region of the summed intensity distribution having a value exceeding "1" to "1".

14. A non-transitory computer readable medium storing a simulation program for simulating a manufacturing process including a first processing using a first mask and a second processing using a second mask, said simulation program causing one or more computers to execute the steps of:

calculating a first intensity distribution generated over the substrate of interest over a first time for processing by the first mask; and calculating a second intensity distribution generated over the substrate over a second time different from the first time by the second mask;

revising an intensity of a region in the first intensity distribution to be processed by the second mask to a value defined as a region not processed, wherein the first mask is different from the second mask, wherein the revising an intensity comprises reversing a sign of the second intensity distribution and then adding the reversed second intensity distribution to the first intensity distribution to provide a summed intensity distribution; and setting a region of the summed intensity distribution having a value of less than "0" to "0", and setting a region of the summed intensity distribution having a value exceeding "1" to "1".

* * * * *